(12) United States Patent
Chatterjee et al.

(10) Patent No.: US 7,286,003 B2
(45) Date of Patent: Oct. 23, 2007

(54) ON-CHIP VOLTAGE REGULATOR

(75) Inventors: Kallol Chatterjee, West Bengal (IN); Nitin Agarwal, Kanpur (IN)

(73) Assignee: STMicroelectronics Pvt. Ltd. (IN)

( * ) Notice: Subject to any disclaimer, the term of this patent is extended or adjusted under 35 U.S.C. 154(b) by 72 days.

(21) Appl. No.: 11/209,351

(22) Filed: Aug. 22, 2005

(65) Prior Publication Data

US 2006/0071703 A1 Apr. 6, 2006

(30) Foreign Application Priority Data

Aug. 20, 2004 (IN) .................. 1559/DEL/2004

(51) Int. Cl.
*G05F 1/10* (2006.01)

(52) U.S. Cl. ...................... 327/540; 327/513

(58) Field of Classification Search .......... 327/513, 327/539, 534, 540, 543
See application file for complete search history.

(56) References Cited

U.S. PATENT DOCUMENTS

| | | | |
|---|---|---|---|
| 5,892,371 A | 4/1999 | Maley | |
| 5,923,211 A | 7/1999 | Maley et al. | |
| 6,686,796 B2 * | 2/2004 | Casper | 327/538 |
| 6,710,642 B1 * | 3/2004 | Tang et al. | 327/539 |
| 6,803,803 B1 * | 10/2004 | Starr et al. | 327/378 |

* cited by examiner

*Primary Examiner*—Jeffrey Zweizig
(74) *Attorney, Agent, or Firm*—Lisa K. Jorgenson; Bryan A. Santarelli; Graybeal Jackson Haley LLP

(57) ABSTRACT

An improved on-chip voltage regulator providing improved reliability by eliminating voltage stresses on critical components, comprising, a reference-signal generating block providing a first-order temperature-compensated voltage-reference signal and a first-order temperature-compensated current-reference signal, an operational-amplifier block providing a regulated voltage, connected to the outputs of said reference signal generating block; a standby protection block receiving an external signal for enabling/disabling said reference-signal generating block and said operational-amplifier block, and; a protection voltage block connected to all said blocks; wherein critical elements of said blocks are connected such that voltage difference between any two terminals is always less than the break down voltage of said critical element.

25 Claims, 15 Drawing Sheets

$Y = \overline{A \cdot B}$ $\overline{A + B}$

US 7,286,003 B2

ON-CHIP VOLTAGE REGULATOR

PRIORITY CLAIM

This application claims priority from Indian patent application No. 1559/Del/2004, filed Aug. 20, 2004, which is incorporated herein by reference.

TECHNICAL FIELD

An embodiment of this invention relates to an improved on-chip voltage regulator. In particular it relates to an on-chip voltage regulator that provides enhanced reliability.

BACKGROUND

As chip-design geometries shrink, the device operating voltages also reduce, resulting in lower breakdown voltages of the on-chip components. However it still remains necessary for the chip to communicate with external circuitry, which may be operating at higher voltages that may often exceed the break down voltages of the on-chip components. In such situations it is important to ensure that the on-chip components are not exposed to high voltage stresses.

FIGS. 1A and 1B show a scheme for protection of digital devices in CMOS technology from high voltage stresses in accordance with U.S. Pat. No. 5,892,371, which is incorporated by reference. This scheme uses special protection transistors biased with reference voltages, Vrefn and Vrefp inside standard digital gates.

This scheme for protecting digital logic suffers from the drawback that it can only be used with digital circuits and is not suitable for analog circuits. Also the use of special protection transistors with each gate results in a heavy penalty in terms of chip area. In the case of universal gates such as a NAND or NOR gates, the addition of the protection transistors also reduces the operating speed. Therefore, when these gates are used in large numbers in a macro cell, not only will the area overhead increase, but the speed of operation of such a cell would also decrease. Such a scheme is also not suitable for analog circuits.

FIG. 2 shows the scheme for generating the reference voltages Vrefn and Vrefp of FIGS. 1A and 1B according to U.S. Pat. No. 5,923,211, which is incorporated by reference. This scheme uses a Bandgap Voltage Reference and two Operational Amplifiers.

Since Vrefn and Vrefp have a finite settling time which depends on the bandwidth of the Bandgap Voltage Reference and the two Operational Amplifiers, the protection mechanism would typically operate a short time after the application of the power supply. During this period the circuit is often unprotected and subjected to the voltage stresses imposed by the power supply and/or the interface signals. The Bandgap Voltage Reference and the two Operational Amplifiers themselves are also often subject to such voltage stresses during this period particularly when these are operated on a supply voltage greater than the breakdown voltage of the constituent transistors.

SUMMARY

According to an embodiment of the present invention, an improved on-chip voltage regulator provides improved reliability by eliminating voltage stresses on critical components. The regulator comprises:

a reference-signal generating block providing a first-order temperature-compensated voltage reference signal and a first-order temperature-compensated current reference signal;

an operational-amplifier block providing a regulated voltage, connected to the outputs of said reference-signal generating block;

a standby-protection block receiving an external signal for enabling/disabling said reference-signal generating block and said operational-amplifier block, and;

a protection voltage block connected to all said blocks;

wherein elements of said blocks are connected such that voltage difference between any two terminals is always less than the break down voltage of said element.

According to an embodiment of the invention, the said reference-signal generating block includes a first-order temperature-compensated reference-voltage generator with an associated startup circuit for providing the voltage-reference output and a first-order temperature-compensated reference-current circuit driven by said reference-voltage generating circuit providing the current-reference output.

According to an embodiment of the invention, the said operational-amplifier block includes an operational amplifier with an associated standby circuit.

According to an embodiment of the invention, the said protection voltage block generates first, second and third protection voltages.

According to an embodiment of the invention, the said elements include transistors.

According to an embodiment of the invention, the said first-order temperature-compensated reference-voltage circuit includes:

a current-mirroring block comprising a plurality of transistors having common first conducting terminals and common control terminals, said control terminals being connected to a second conducting terminal of a main transistor branch, an enabling/disabling transistor having its conducting terminals connected to said common-control terminal and said common first-conducting terminals and its control terminal driven by said standby-protection block;

at least one protection transistor connected to the second conducting terminals of said current-mirroring transistors, with its control terminal is connected to said first or second protection voltage;

a band-gap circuit driven by second conducting terminals of a set of first protection transistors;

a differential amplifier driven by the second conducting terminals of a second protection transistor, receiving an input from said band-gap circuit, and having a tank circuit connected to its output, a voltage-to-current converter connected to the output of said differential amplifier and driven by the main transistor branch through a third protection transistor and having a startup circuit at its input for initiating operation of the circuit;

second enabling/disabling transistor connected to the output of said differential amplifier, and being enabled/disabled by a control signal from said standby protection block; and an output circuit for providing a voltage reference signal of said reference signal block having a resistor and a bipolar-junction transistor connected in series and driven by a second conducting terminal of a fourth protection transistor.

According to an embodiment of the invention, the said first-order temperature-compensated reference-current circuit includes:

a second current-mirroring block comprising a plurality of transistors having common first-conducting terminals and common control terminals, said common control terminals being connected to a second conducting terminal of a main transistor branch;

an enabling/disabling transistor having its conducting terminals connected to said common control terminal and common first-conducting terminals of said transistors while its control terminal is controlled by a control signal from said standby-protection block for enabling/disabling;

a driving- and an input-generating transistor branch having its first conducting terminals connected to the common first-conducting terminal of said second current-mirroring block while its control terminal is connected to said common control terminals of said first current-mirroring block;

at least one protection transistor connected to second conducting terminals of each branch of transistors, the control terminal of the said protecting transistor being connected to said first or second protection voltage;

said input generating transistor branch has a resistor and a bipolar-junction transistor in series to provide a input between the said bipolar-junction transistor and resistor;

a current summer having a pair of bipolar-junction transistor and a resistor in parallel driven by first branch of the said second current-mirroring block;

a second differential amplifier driven by said driving transistor branch, receiving its first input from said input generating branch and second input from said current summer, and having a tank circuit connected at its output;

a second voltage-to-current converter connected to the output of said differential amplifier and driven by the main transistor branch through a third protection transistor another enabling/disabling transistor connected to the output of said differential amplifier with its control terminal being controlled by another control signal from said standby-protection block for enabling/disabling.

According to an embodiment of the invention, the said standby-protection block includes:

an inverter that receives an external input signal and provides an inverted external output signal;

a first voltage level shifter that receives an external input signal and inverted external signal and provides a shifted voltage between the ground voltage and a first intermediate voltage;

a second voltage level shifter that receives a pair of complimentary inputs from said first voltage level shifter and provides a shifted voltage between supply voltage and a second intermediate voltage level, and;

a Metal Oxide Semiconductor (MOS) switch with support circuitry that receives inputs from the said first and second voltage level shifters and provides a controlled driving voltage to said first common conducting terminals of the said first and second current mirroring blocks of said first order temperature compensated reference voltage and reference current circuits;

each said element having protecting elements to provide voltage stress free circuitry.

According to an embodiment of the invention, the said inverter is a stress-free inverter with a protecting element connected between supply and inverter.

According to an embodiment of the invention, the said protecting element is diode-connected transistor connected to another transistor having its control terminal connected to a protection voltage.

According to an embodiment of the invention, the said first voltage-level shifter has a diode-connected transistor connected to a pair of transistors between supply and said level shifter, said pair of protection transistors having their control terminals connected to a protection voltage.

According to an embodiment of the invention, the said second voltage-level shifter has a pair of transistors having their control terminals connected to said third protection voltage and conducting terminals connected in parallel with cross-connected transistors of said second voltage-level shifter and said set of protection transistors connected in series between said cross-connected transistors and input transistors of said second voltage-level shifter, said set of protection transistors having their control terminals connected to said first and second protection voltages.

According to an embodiment of the invention, the MOS switch has a pullup transistor connected in parallel with said MOS switch, said pullup transistor having its control terminal connected to said third protection voltage, the control terminal of MOS switch being connected to a series of diode-connected transistors, the current though said series of diode-connected transistors being controlled by a series of transistors having their second conducting terminal connected to another series of diode-connected transistors through a protection transistor.

DETAILED DESCRIPTION

Figure 3A:
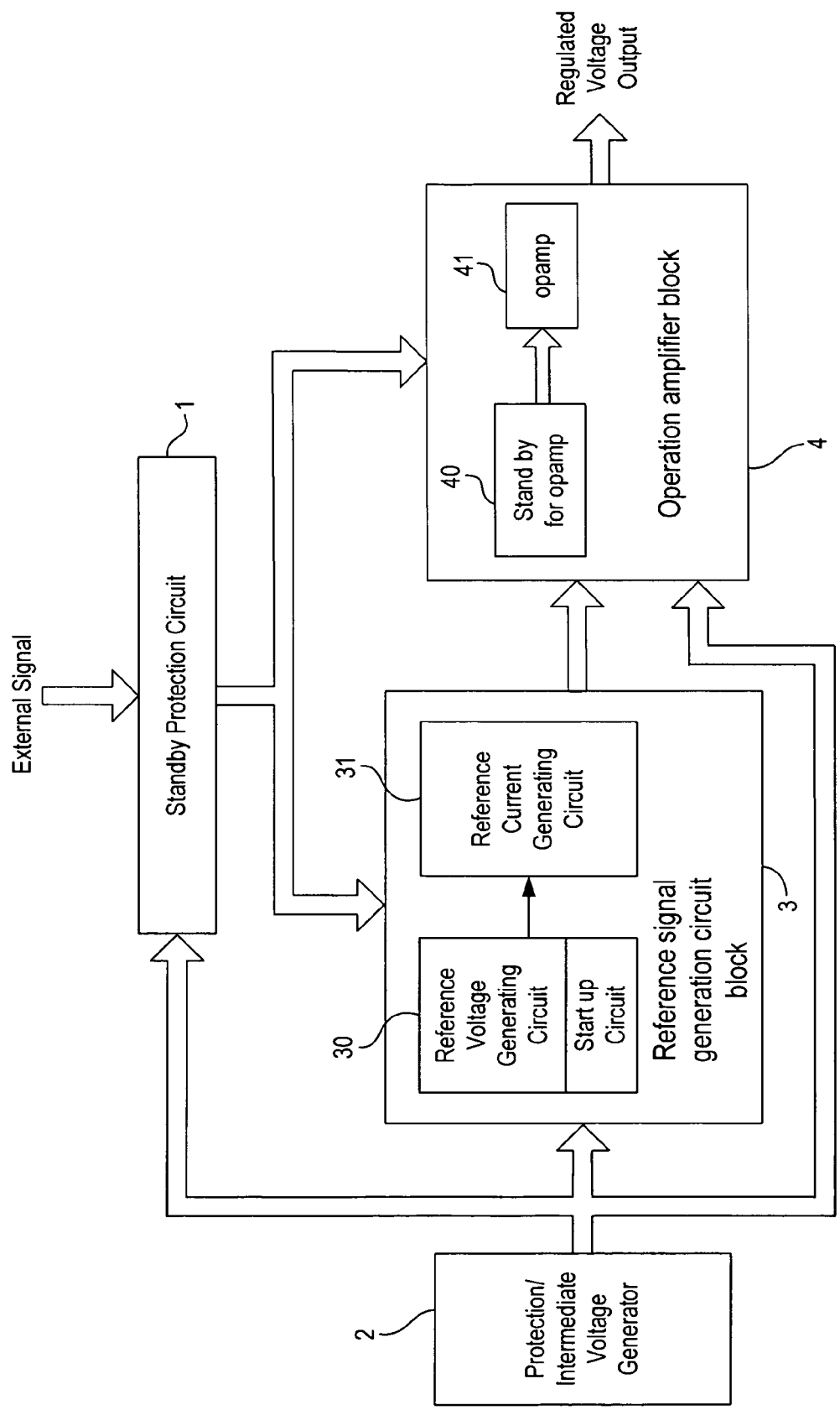
FIG. 3a shows block diagram of an embodiment of the present invention.

FIG. 3a shows a block diagram according to an embodiment of the invention. The voltage regulator has a standby-protection circuit 1, a protection-voltage generator 2, reference-signal generator 3 and an operational-amplifier block 4 connected to each other to provide a regulated voltage output. The standby-protection circuit 1 receives an external signal and the reference voltages from protection-voltage generator 2.

The role of the standby circuit 1 is to put the reference signal generating block 3 in the standby mode, in which the circuit consumes only leakage current, if the external input signal to the circuit requires such an operation, and also to enable the operational-amplifier block 4 when its inputs from the reference-signal generators 3 have settled to the proper voltage values. In the standby protection circuit 1, the external signal is processed to acceptable voltage values by the stress-free inverter and level shifter. A stress-free control transistor is provided within block 1 for enabling or disabling circuit operation. The control-transistor circuitry and blocks 3 and 4 use the signals generated by the stress-free inverter and the level shifters.

The reference-signal generator 3 receives inputs from the standby block 1 and the protection-voltage generator 2. In the reference-signal generator 3, block 30 generates a first-order temperature-compensated reference voltage, and block 31 generates a first-order temperature-compensated current.

The operational amplifier block 4 receives inputs from the standby-protection block 1, protection-voltage generator 2 and the reference-signal generator 3, and provides a regulated output voltage. This block incorporates an operational amplifier 41 and a separate standby circuit 40.

All the circuits used in each of the above blocks are designed such that none of their circuit component is under voltage stress at any time.

Figure 1A:
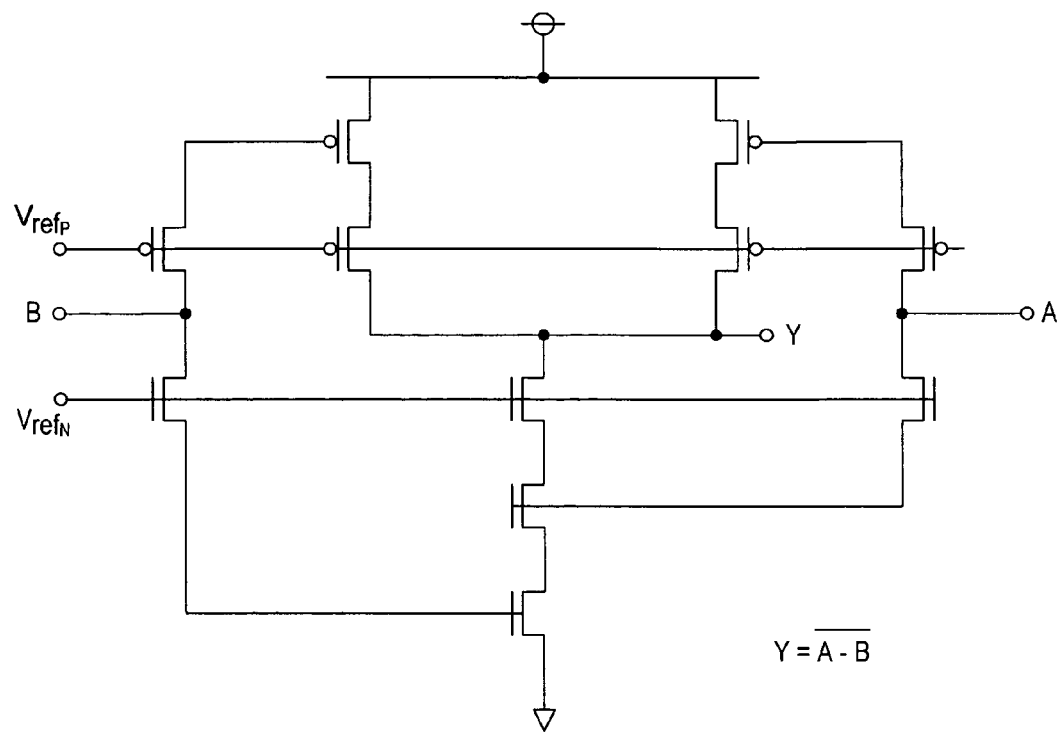
FIGS. 1A and 1B show a scheme for protection of digital devices in CMOS technology from high-voltage stresses in accordance with the prior art.
Figure 1B:
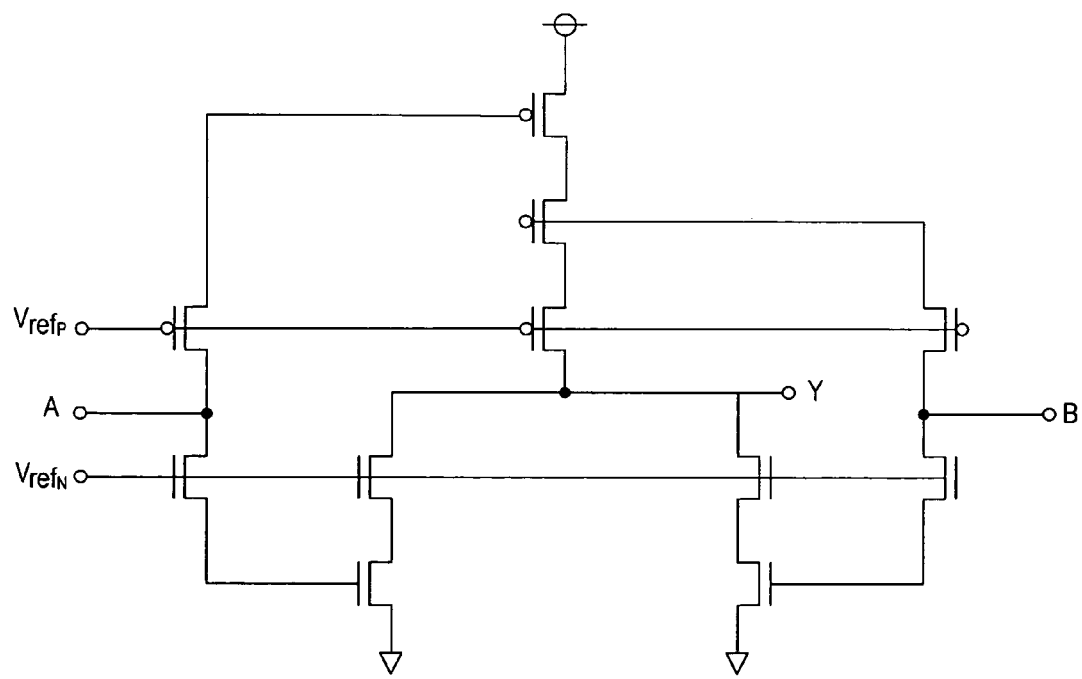
Figure 2:
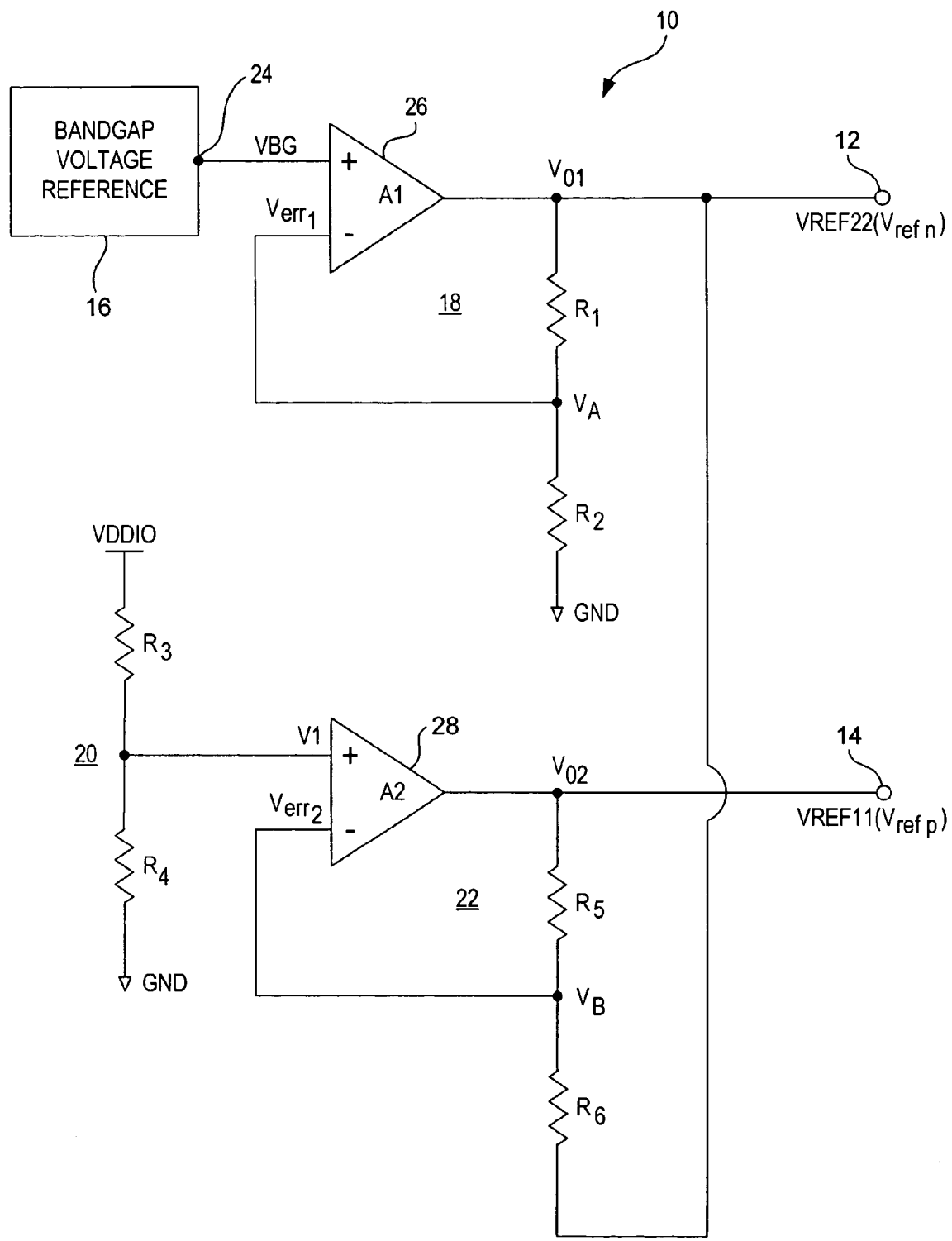
FIG. 2 shows a technique for generating the reference voltages of FIG. 1 in accordance with the prior art.
Figure 3B:
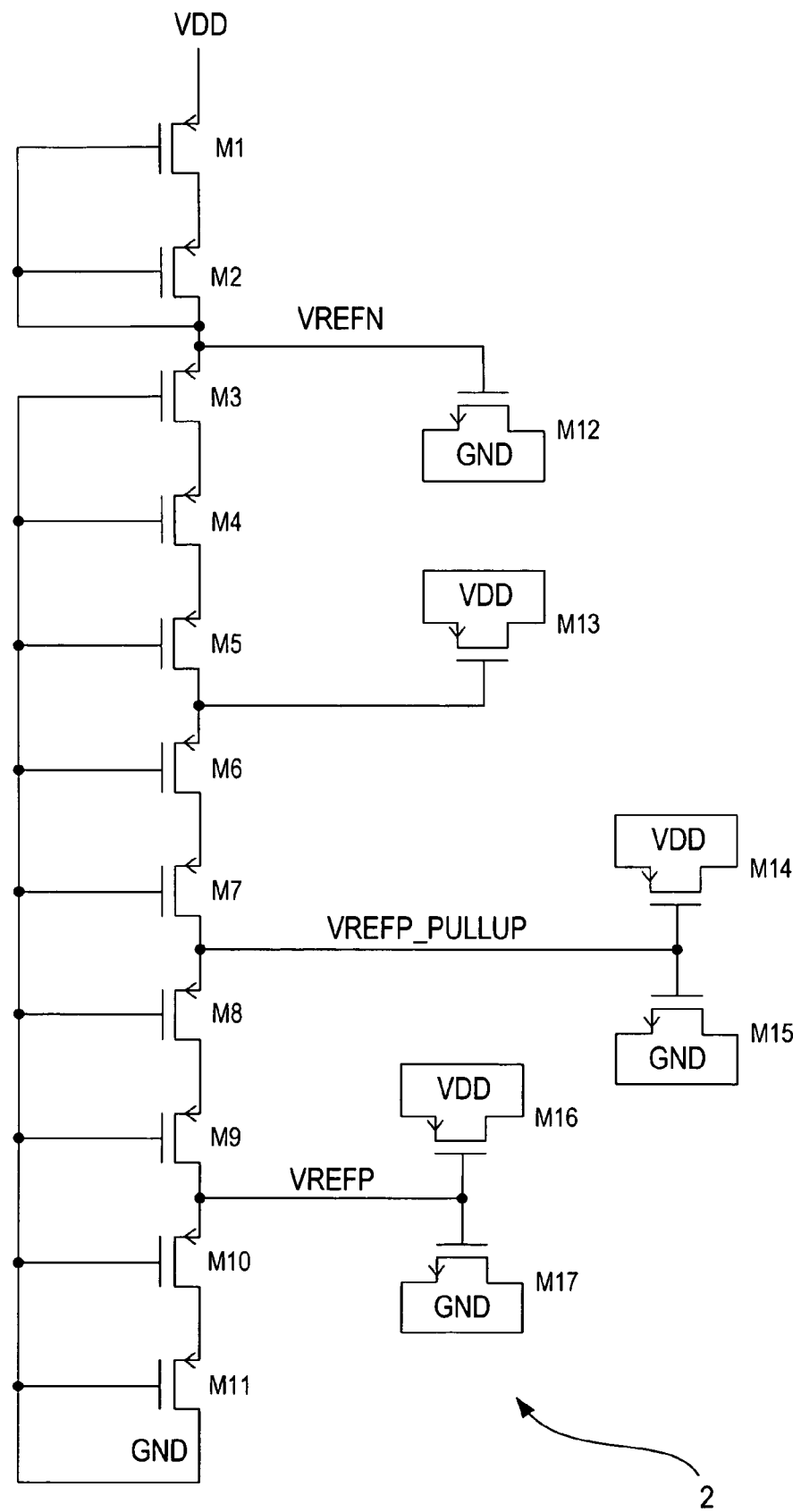
FIG. 3b shows a protection-voltage generator block according to an embodiment of the present invention.

FIG. 3b shows the protection-voltage generator block 2 of FIG. 1 according to an embodiment of the invention. The protection-voltage generator 2 has series connected transistors M1-M11. The first protection voltage VREFN is tapped at the drain of transistor M2. The number of subsequent series transistors (M3 onwards) are selected so that the first protection voltage VREFN is sufficient to ensure that transistors M1 and M2 are not exposed to high voltage stresses due to the external power supply (VDD). The gates of the transistors M1 and M2 are shorted with the drain of transistor M2, as a result of which the transistor M2 is diode connected and reduces VREFN to a value which is sufficiently lower than the breakdown voltage of the MOS transistors. This also ensures that M3 is not under voltage stress and as a result, M4 and the subsequent transistors connected to the ground terminal are also free of voltage stress.

M1 is protected from high voltage stresses since its drain is at VDD-Vsd. The second and third reference voltages, VREFP and VREFP_PULLUP are tapped from appropriate nodes (here the drains of M6 and M9, respectively) in the series of transistors.

The protection voltage block 2 is provided with charge tanks M12-M17. The charge tanks ensures that even when the supply VDD is ramping up from zero volts to the final value, the constituent transistors in the protection voltage generator block are not subjected to high voltage stresses. These charge tanks capacitively couple the supply transients to the protection voltages, tapped from different nodes within the circuit, thus improving the transient behavior of the protection voltages. While the charge tanks M12, M15, M14, M16 and M17 improve the transient behavior of the three protection voltages, the charge tank M13 allows VREFN to remains unaffected by the high-frequency noise at the power supply for the purpose of improved regulation at the output of the operational amplifier.

If the operating voltage is A and the typical operating voltage of a transistor in a particular CMOS technology is B then The maximum value of VREFN is

VREFN=B

Further, the value of VREFP can be determined by

VREFP=[A−B]

The maximum value of VREFP+Vtp should not exceed (0.9*B), where Vtp is the threshold voltage of the PMOS transistors.

The Voltage VREFP_PULLUP can be computed as

VREFP_PULLUP=VREFP+(2*Vsd)

Assuming that the transistors M8 and M9 are identical and have the same source to drain voltage (Vsd).

Figure 4:
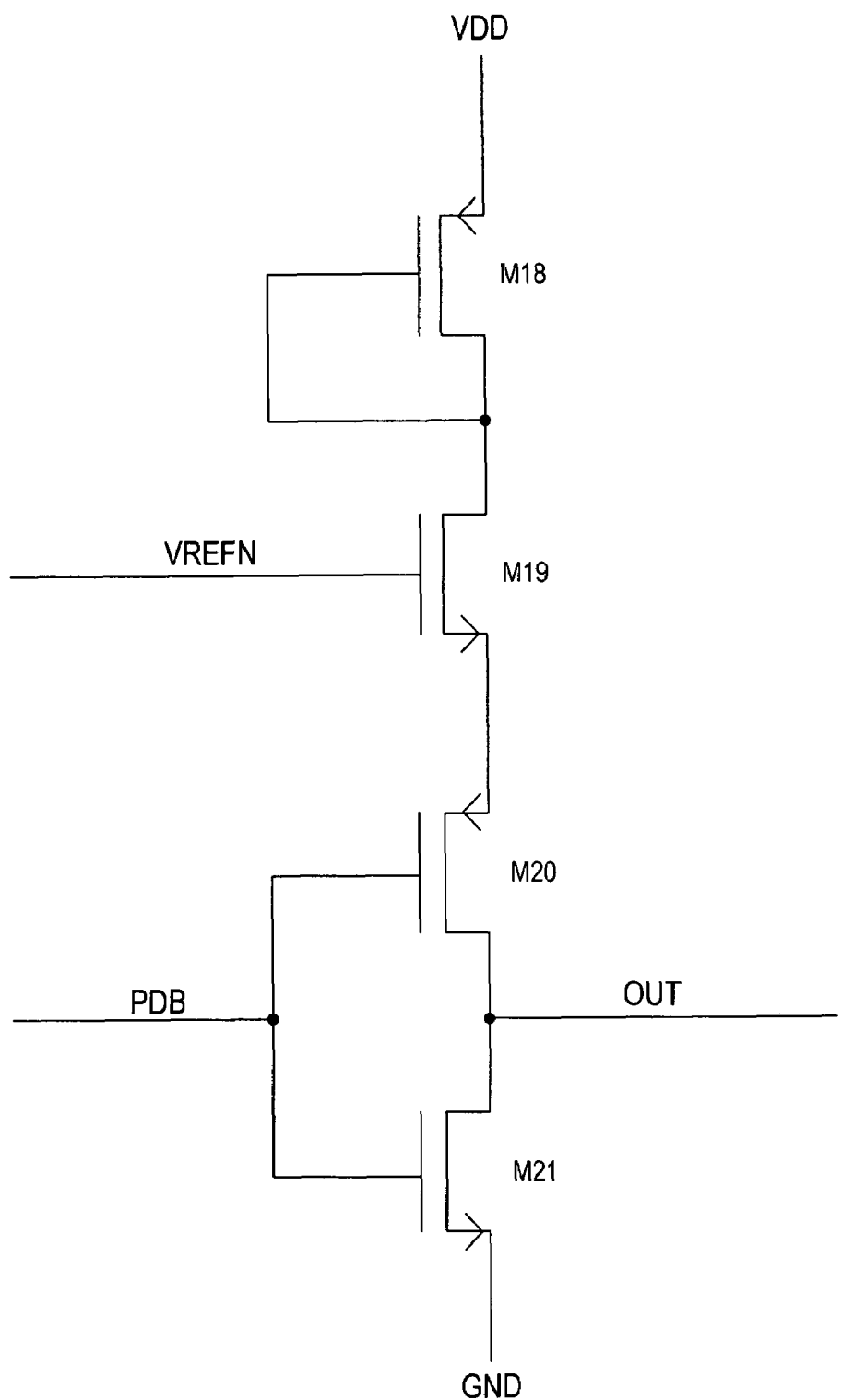
FIG. 4 shows a high-voltage stress-free inverter according to an embodiment of the present invention.

FIG. 4 shows a high-voltage stress-free inverter according to an embodiment of the invention. The supply VDD is biased to the inverter through transistors M18 and M19. Transistor M19 has its gate connected to VREFN. When the external input signal PDB is at a high voltage, transistors M18, M19 and M20 are weakly conducting and hence the voltages at the drain and source of M19 do not drop significantly below VDD-Vtp and VREFN-Vtn respectively. Transistor M21 being strongly conducting in this case pulls the output of the inverter to zero volts. Since the voltage at the source of M19 cannot be higher than VREFN-Vtn in any case, M20 and M21 are also protected from high voltage stresses. When PDB is at zero volts, the output is at VREFN-Vtn.

Figure 5:
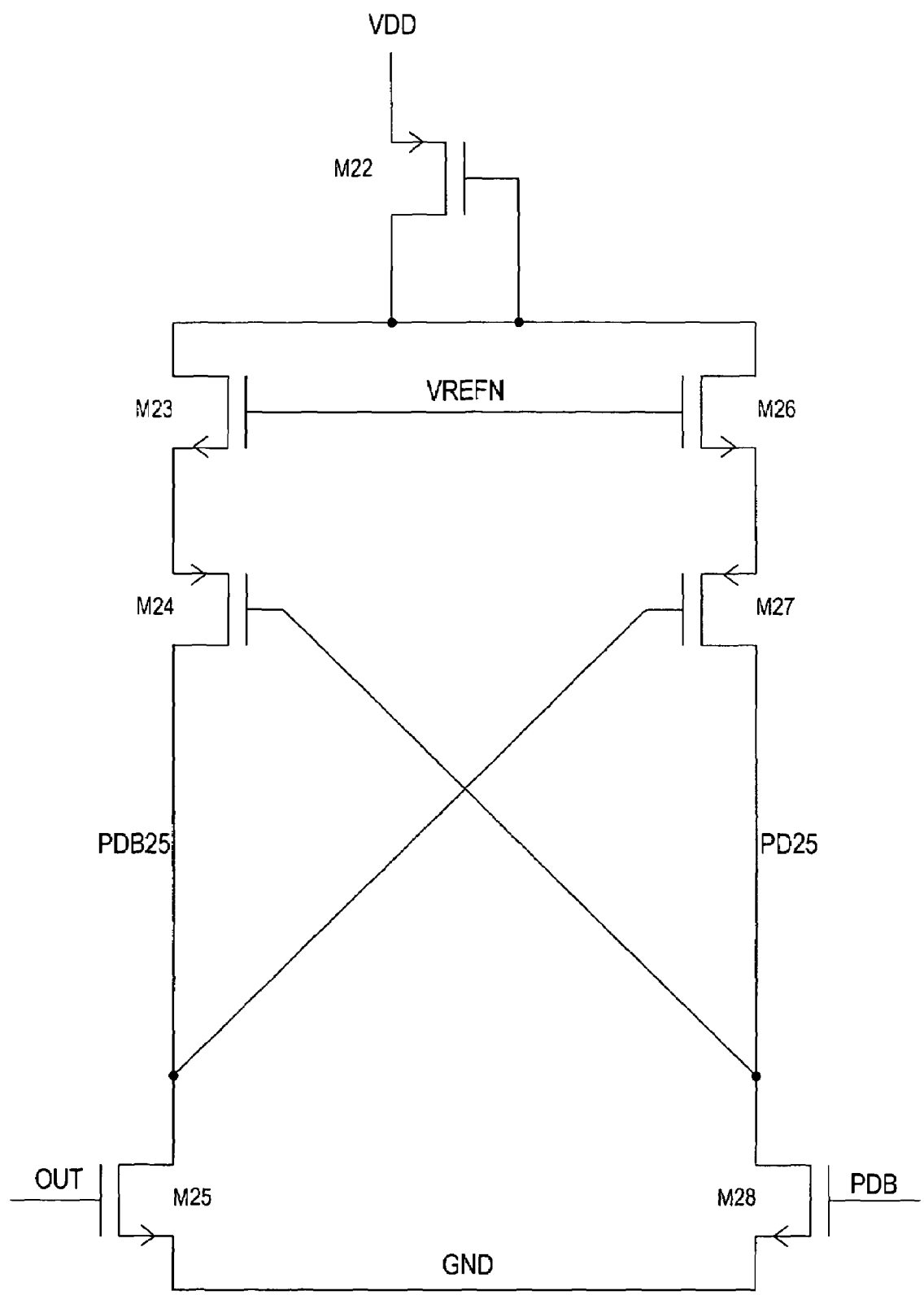
FIG. 5 shows a level shifter according to an embodiment of the present invention.

FIG. 5 shows a high-voltage stress-free level shifter according to an embodiment of the invention. The level shifter is biased thought a diode-connected transistor M22 followed by transistors M23 and M26 in both of its branches. Transistors M23 and M26 have their gates connected to VREFN and therefore for the reasons discussed previously, all the transistors are assured of no voltage stress. The level shifter receives its input from the external source PDB and the inverter OUT of FIG. 4 and provides the outputs PD25, PDB25. It will be understood by a person skilled in the art that the outputs PD25 and PDB25 are of two voltage levels, zero volts and VREFN-Vtn.

Figure 6:
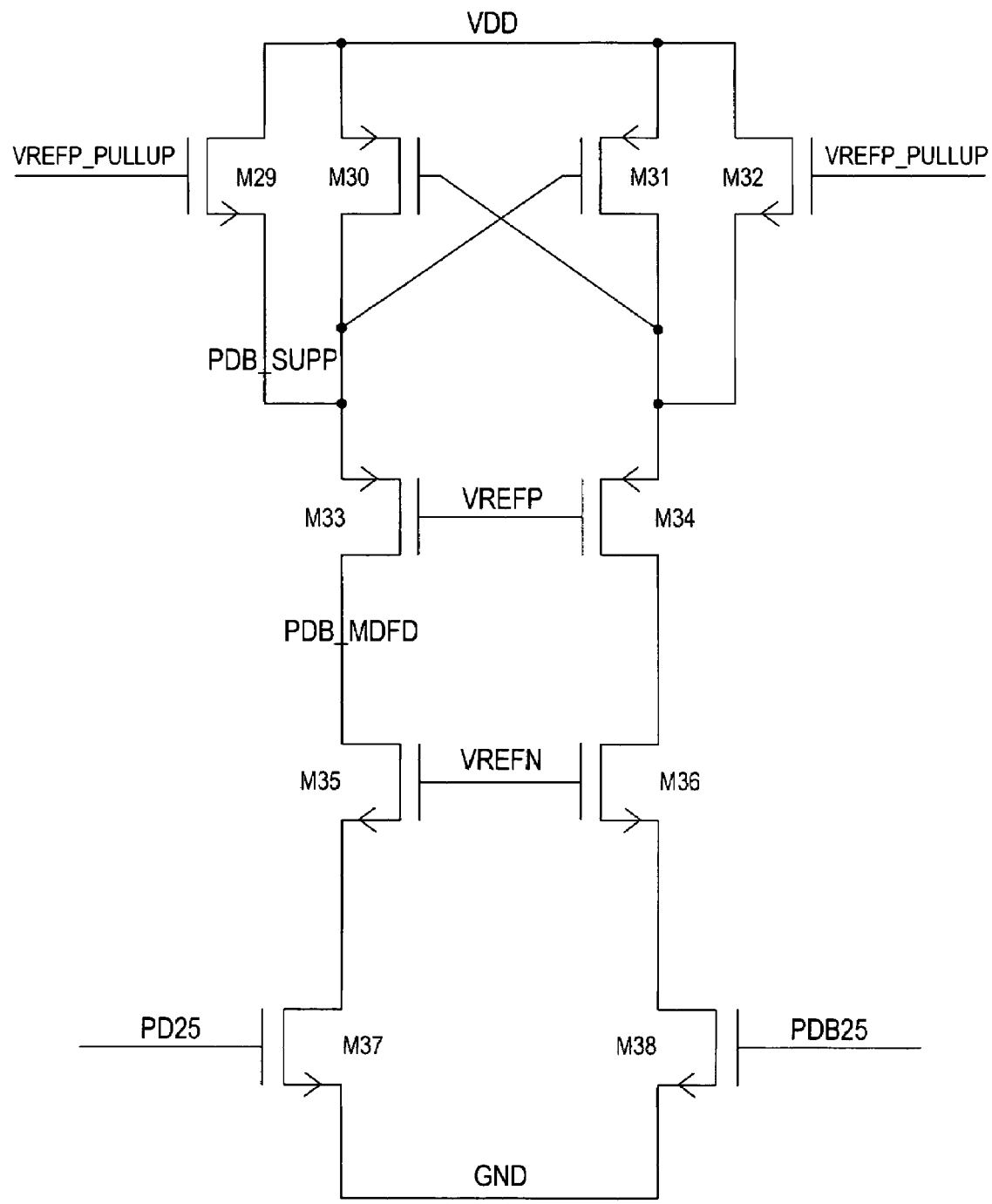
FIG. 6 shows another implementation of a level shifter according to an embodiment of the present invention.

FIG. 6 shows another embodiment of a stress-free voltage-level shifter that receives inputs PD25 and PDB25 from the shifter of FIG. 5 and generates output signals PDB_SUPP and PDB_MDFD. These output signals are of two voltage levels, VDD and VREFP+|Vtp|.

The operation of the circuit can be understood as follows. The gates of the transistors M37 and M38 receive complementary signals PD25 and PDB25 and therefore one of the transistors M37 or M38 would conduct. Assuming that transistor M37 is conducting, then the voltage at the drain of transistor M30 reduces, which results in partially switching on transistor M31 but the part of the circuit connected at the drain of M31 does not conduct. Hence the drain of M31 charges up to VDD and switches off the transistor M30 completely. As a result of this, the source of transistor M33 is disconnected from the supply (VDD). Now, the gate of the transistor M33 is connected to VREFP and therefore the source of this transistor settles at VREFP+|Vtp|, which is the desired PDB_SUPP. With PDB_SUPP settling at this value, all transistors which are below M33 in this branch, are protected from high voltage stresses. The drain of the transistor M33 continuously discharges to settle at GND, which is the desired PDB_MDFD. A similar operation occurs when transistor M38 conducts.

When the power supply is switched on, it is possible that the drain of transistors M30 or M31 are at ground potential and since the sources of these transistors are connected to supply voltage, the transistors might be momentarily exposed to high voltage stresses. Transistors M29 and M32 have been provided to avoid such a situation. The gates of these transistors are connected to VREFP_PULLUP and their sources are connected to the drains of M30 and M31 respectively. Since the gates of these transistors are connected to VREFP_PULLUP the sources of these transistors will not fall below VREFP_PULLUP−|Vtn| and therefore will protect the transistors M30 and M31 from being exposed to high voltage stresses.

Figure 7:
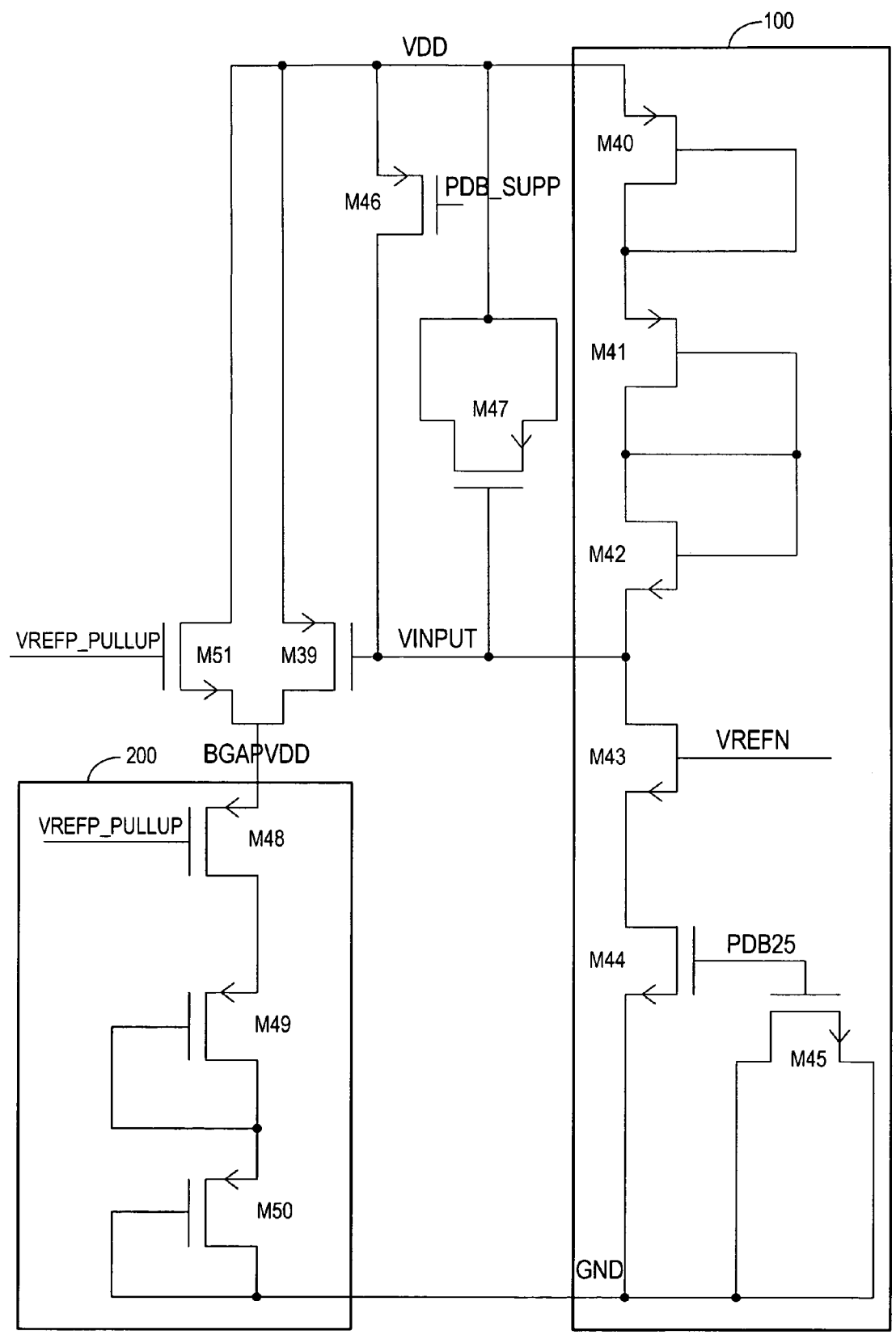
FIG. 7 shows a MOS switch in accordance with an embodiment of the present invention.

FIG. 7 shows a PMOS switch according to an embodiment of the invention. The role of this switch is to connect/disconnect the circuit from the power supply depending on the external input signal (PDB). Transistor M39 has its gate connected to the output of block 100 (VINPUT). The conducting terminals of transistor M39 are connected to the supply VDD and block 200 respectively. Transistor M46 is provided to connect power supply VDD and the gate of transistor M39. The gate of transistor M46 is connected to PDB_SUPP. A ramp-up protecting transistor M51 is provided in parallel with transistor M39. The gate of transistor M51 is connected to VREFP_PULLUP. A tank M47 is connected between the gate of transistor M39 and the power supply VDD to ensure proper operation of the circuit during the power supply ramp-up. The drain of the transistor M39 named as BGAPVDD provides a supply voltage to the reference-signal generating block 3 of FIG. 3A and its startup circuit.

Block 100 has a plurality of series connected transistors M40, M41, M42, M43 and M44. Transistors M40, M41 and M42 are diode-connected transistors whereas M43 has its gate connected to VREFN. Transistor M44 controls the current flowing through the series connected transistors. The input of the block 100, PDB25 is connected to the gate of the transistor M44. A charge tank M45 is provided to slow down signal PDB25 when the supply ramps up because there is a possibility that if PDB25 rises rapidly to a high voltage, the drain voltage of M44 may, before settling at the desired voltage value, instantaneously decrease to such a voltage level which may bring about a large Vds across M43 and hence stress it. The drain voltage VINPUT of the transistor M43 is the output of block 100.

Block 200 has a series of transistors M48, M49 and M50. The transistors M49 and M50 are diode-connected transistors, whereas transistor M48 receives its gate input as VREFP_PULLUP. One of the conducting terminals of transistor M48 connects to the drain of transistor M39 and the other conducting terminal connects to the series of diode-connected transistors.

The operation of the circuit can be understood in two stages, power-down or standby-mode operation and conducting-mode operations described below.

Power-Down or Standby Mode:

In this mode the signal PDB25 and PBD_SUPP are low and therefore the transistor M46 pulls up the node VINPUT to the supply voltage level and hence BGAPVDD would be left floating. Transistor M44 is not conducting and hence there is no current flow through the series connected transistors of block 100. BGAPVDD may, due to subthreshold conduction in the circuitry it is connected to, slowly discharge to zero volts, thus generating unacceptably high source to drain voltage across the transistor M39. To avoid this, a weak pull up transistor M51 is used. The transistor M51 has its gate connected to one of the intermediate voltages VREFP_PULLUP. Thus the voltage at BGAPVDD would not fall below VREFP_PULLUP-Vtn which would prevent the transistor M39 from developing voltage stress.

Further, when PDB25 is low, block 100 is non conducting but had M43 not been there, the voltage at the node VINPUT could be substantially higher to bring transistor M44 under voltage stress. Transistor M43 with its gate connected to voltage VREFN brings the drain of transistor M44 to VREFN-Vtn which is substantially lower in value. Further, subthreshold conduction in block 100 may cause the gate of M39 to be slightly lower than the supply voltage, turning M39 weakly on. For strongly turning M39 off, a pullup transistor M46 is provided to charge the gate of M39 to the supply voltage.

Power-on Mode:

During the power-on mode, block 200 pulls down the voltage of BGAPVDD to VREFP_PULLUP+|Vtp|, thus ensuring no stress for the transistors in the reference signal generating block and its startup circuit. During supply rampup, the node voltages within the reference signal generating block may be such as to create stresses on its circuit elements, when a large voltage appears at BGAPVDD. Hence it may be necessary to disconnect the supply from the reference-signal generating block 3 (FIG. 3A) during supply rampup, irrespective of the polarity of the external input signal. This can be achieved if the gate and the source of transistor M39 have the same voltage during supply rampup, thus giving it zero Vsg (difference between source and gate voltage) and hence disconnecting it from the supply. Since the node VINPUT serving as the gate of M39 may not follow the power supply during its rampup, a charge tank M47 is added which couples VINPUT to VDD during supply rampup, making M39 off during the transient and thus ensuring protection of the circuit elements in the reference signal generating block and its startup circuit.

Figure 8:
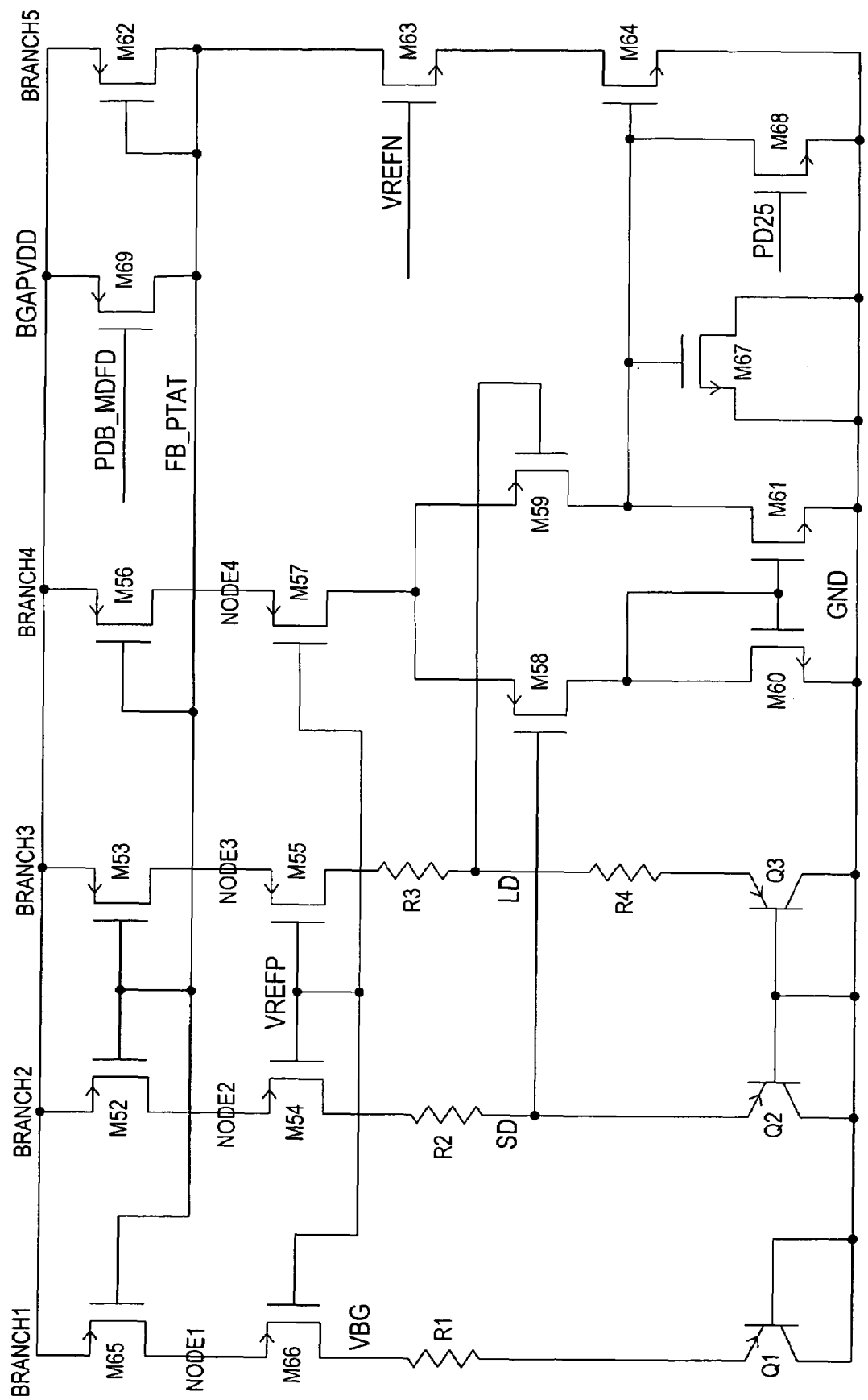
FIG. 8 shows a first-order temperature-compensated voltage-reference circuit according to an embodiment of the present invention.

FIG. 8 shows an embodiment of temperature-compensated reference-voltage generator 30 (FIG. 3A). This generator uses a bandgap circuit coupled with a differential amplifier; a current-mirror circuit drives both the bandgap circuit and the amplifier. The output of the amplifier controls the current flowing through the current mirror to provide a compensated reference voltage at the output. The circuit is provided with additional transistors to introduce an intermediate voltage level so that none of the components of the circuit are under voltage stress.

In the circuit BRANCH1, BRANCH2, BRANCH3, BRANCH4 and BRANCH5 are the current-mirror branches having mirroring transistors M65, M52, M53, M56, and M62. The gates of all the mirroring transistors FB_PTAT are connected to the drain of transistor M62. BRANCH2 and BRANCH3 drive the bandgap circuit, comprising the bipolar junction transistors Q2 and Q3 and resistors R2, R3 and R4. The transistors M58, M59, M60 and M61 form the amplifier. The input transistors M58 and M59 of the amplifier receive voltage outputs of the bandgap circuit SD and LD at their gates. The output of the amplifier is provided to the gate of the transistors M64. The transistor M64 is current controlling transistor of the BRANCH5 of the current mirror circuit. Transistors M68 and M69 are provided for enabling or disabling the circuit operation. The charge tank M67 is provided for stabilizing the operation of the circuit at high frequencies. The BRANCH1 has a bipolar junction transistor Q1 and a resistor R1, the voltage VBG is the output reference voltage of the circuit. The voltage can be computed as $$VBG=Veb+\{[Vt\ ln(n)/R4]*R1\}$$

Where, Veb is the emitter-base voltage difference of the transistor Q1 and Vt is the thermal voltage and n is the base-emitter area ratio of the two bipolar-junction transistors, Q2 and Q3.

The transistors M66, M54, M55, M57 and M63 are the protection transistors. These transistors introduce an intermediate voltage level in the each branch of the current mirror thus ensuring that the components of the circuit are not under voltage stress.

The operation of the circuit can be understood as follows.

Power Down Mode

The transistor M69 and the transistor M68 are the control transistors that enable or disable circuit operation. In the power down mode the gate of transistor M69 is at zero volts, thus pulling up all the gates of mirroring transistors to BGAPVDD and thereby disabling them. Further, the gate transistor M68 is at PD25, which is high therefore pulling down the gate of transistors M64 to zero volts and turning it off.

Power On Mode

In the power on mode transistors M68 and M69 are not conducting and therefore the circuit operation is enabled.

In this circuit cascode transistors M66, M54, M55 and M57 are provided with their gates connected to VREFP and hence NODE1, NODE2, NODE3 and NODE4 are raised to VREFP+|Vtp|+$\{(2*Ip*Lp)/(Mp*Cox*Wp)\}^{0.5}$ where
Ip=current flowing in the particular branch,
Lp=Length of the MOS transistor,
Wp=Width of the MOS transistor,
Mp=Mobility of holes in the PMOS transistor,
Cox=Gate Oxide Capacitance per unit area.

Thus the low Vsd across M65, M52, M53 and M56, protects them from high voltage stresses. M64 is also protected likewise by protection transistor M63 by ensuring that the drain is not higher than VREFN−Vtn−$\{(2*In*Ln)/(Mn*Cox*Wn)\}^{0.5}$ where
In=current flowing in the particular branch,
Ln=Length of the MOS transistor,
Wn=Width of the MOS transistor,
Mn=Mobility of electrons in the NMOS transistor,
Cox=Gate Oxide Capacitance per unit area.

thus maintaining a low Vds across M64.

When the circuit is enabled, a current flows through BRANCH2 and BRANCH3, generating different voltages at SD and LD initially. The differential amplifier amplifies this voltage difference. The output of the differential amplifier is connected to the gate of transistor M64 that controls the current flowing through BRANCH5 and therefore the current flowing through the rest of the branches of the current mirror circuit. This new current flowing in the branches BRANCH2 and BRANCH3 would make these two voltages SD and LD come as close as possible to each other so that the required operating current of the circuit is achieved. This current is then converted into voltage by BRANCH1 to provide a temperature compensated voltage VBG.

For the purpose of illustration, the bandgap circuit uses bipolar-junction transistors (BJT) Q2, Q3 with base-emitter area ratio of 1:20 and a resistance R4. A person skilled in art will appreciate that bandgap circuit can be employed using other base-emitter area ratios also. The current can be computed as follows:

$$Iptat=Vt\ ln\ (20)/R4$$

Where Vt is the thermal voltage.

The current flowing through BRANCH1 is allowed to flow through the resistor R1 and the BJT Q1 to provide the first order temperature compensated reference voltage VBG, which is given by:

$$VBG=Veb+(Iptat*R1)$$

where Veb is the emitter-base voltage of transistor Q1. This reference voltage is used as an input to the two-stage operational amplifier 4 (FIG. 3A).

The charge tank M67 at the output of the differential amplifier is used to ensure the stability of the circuit at high frequencies.

Figure 9:
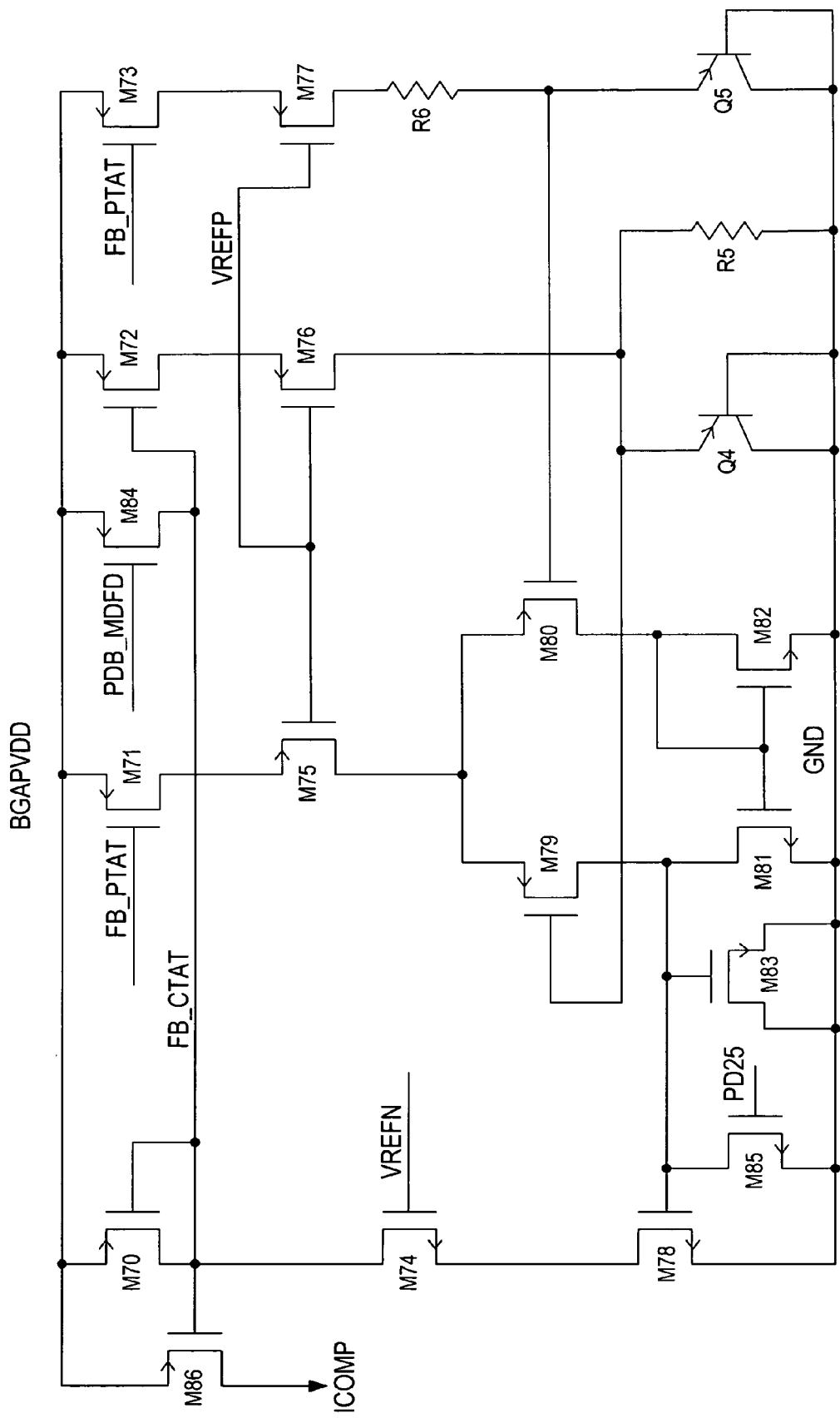
FIG. 9 shows a first-order temperature-compensated current-reference circuit, in accordance with an embodiment of the present invention.

FIG. 9 shows an embodiment of a first-order temperature-compensated reference current generator. This generator uses a differential amplifier coupled with a current-summer circuit and a voltage-input generating branch. A current mirror circuit drives the current summer. The current-mirror circuit of first-order temperature-compensated reference-voltage generator (FIG. 8) controls the current flowing through differential amplifier. The output of the differential amplifier controls the current flowing through the current mirror to provide a first-order compensated reference current at the output. The circuit is provided with additional transistors to introduce an intermediate voltage level so that none of the component of the circuitry is under voltage stress.

In this circuit the current mirror has a current-controlling branch comprising transistor M70 and a current-mirroring branch comprising transistor M72. The gates of the transistors M70 and M72 are connected to drain FB_CTAT of transistor M70. The mirroring branch drives current-summer circuit comprising BJT Q4 and resistor R5 connected in parallel. The transistors M79, M80, M81 and M82 form a differential amplifier having gates of transistors M79 and M80 as the input terminals of the differential amplifier. The differential amplifier is connected to the supply BGAPVDD through the transistor M71. The gate of this transistor M71 is connected to the terminal FB_PTAT so as to provide the bias current of the differential amplifier. The input transistors M79 and M80 of the amplifier receive voltage outputs from the current summer and input generating branch. The output of the differential amplifier is provided to the gate of the transistors M78 of the current-controlling branch in the current mirror circuit. The transistor M78 controls the current flowing through the current-controlling branch of the current-mirror circuit. The input generating branch has transistor M73 whose gate terminal is connected to FB_PTAT and therefore, the current flowing through this branch is the same as the operating current of BRANCH2 of the reference-voltage generating circuit (FIG. 8). This branch is further comprised of a resistor R6 and a BJT Q5 connected in series. The emitter terminal of the BJT provides input to the differential amplifier. The circuit is provided with cascode transistors M74, M75, M76, and M77 for introducing an intermediate voltage level for stress protection. Transistors M84 and M85 are provided for enabling or disabling the circuit operation.

The operation of the circuit can be understood in two modes namely power down mode and power on mode as follows:

Power Down Mode

The transistor M84 and M85 are the control transistor that enable or disable circuit operation. In the power down mode the gate of transistor M84 is low hence pulling up FB_CTAT to BGAPVDD thereby disabling the current mirror transistors. Further, the gate of transistor M85 is at PD25, which is high therefore, pulling down the gate of transistor M78 to zero volts and hence this transistor becomes non-conducting.

Power On Mode

In the power on mode transistors M84 and M85 are not conducting therefore the circuit is enabled. In this circuit, cascode transistors M75, M76 and M77 are provided with their gates connected to the intermediate voltage levels VREFP, hence the source of these transistor is raised to $$VREFP+|Vtp|+\{(2*Ip*Lp)/(Mp*Cox*Wp)\}^{\wedge} 0.5$$

and the source of M74 is lowered to $VREFN-|Vtn|-\{(2*In*Ln)/(Mn*Cox*Wn)\}^{\wedge} 0.5$. Where the parameters above, are as defined previously.

When the circuit is enabled, a current flows through the transistors M70, M71, M72 and M73, which results in voltages at the output of the current summer and input-generating branch providing input to the differential amplifier. The differential amplifier produces a voltage at its output proportional to difference of the input voltage. The output of the differential amplifier is connected to the gate of transistor M78. This gate voltage controls the current through the transistor M78 and therefore controls the current through current controlling branch of the current mirror. The current through the current mirror stabilizes at the operating current, which is then mirrored to provide first-order temperature-compensated output current.

This current can be computed as:

$$Icomp=\{Veb/R5\}+Vt\ ln\ (n)/R4$$

Where Veb is the emitter-base voltage of Q4 and n is the base-emitter ratio of Q2 and Q3 in the reference-voltage generating block of FIG. 8.

The charge tank M83 at the output of the differential amplifier ensures stability of the circuit at high frequencies.

Figure 10:
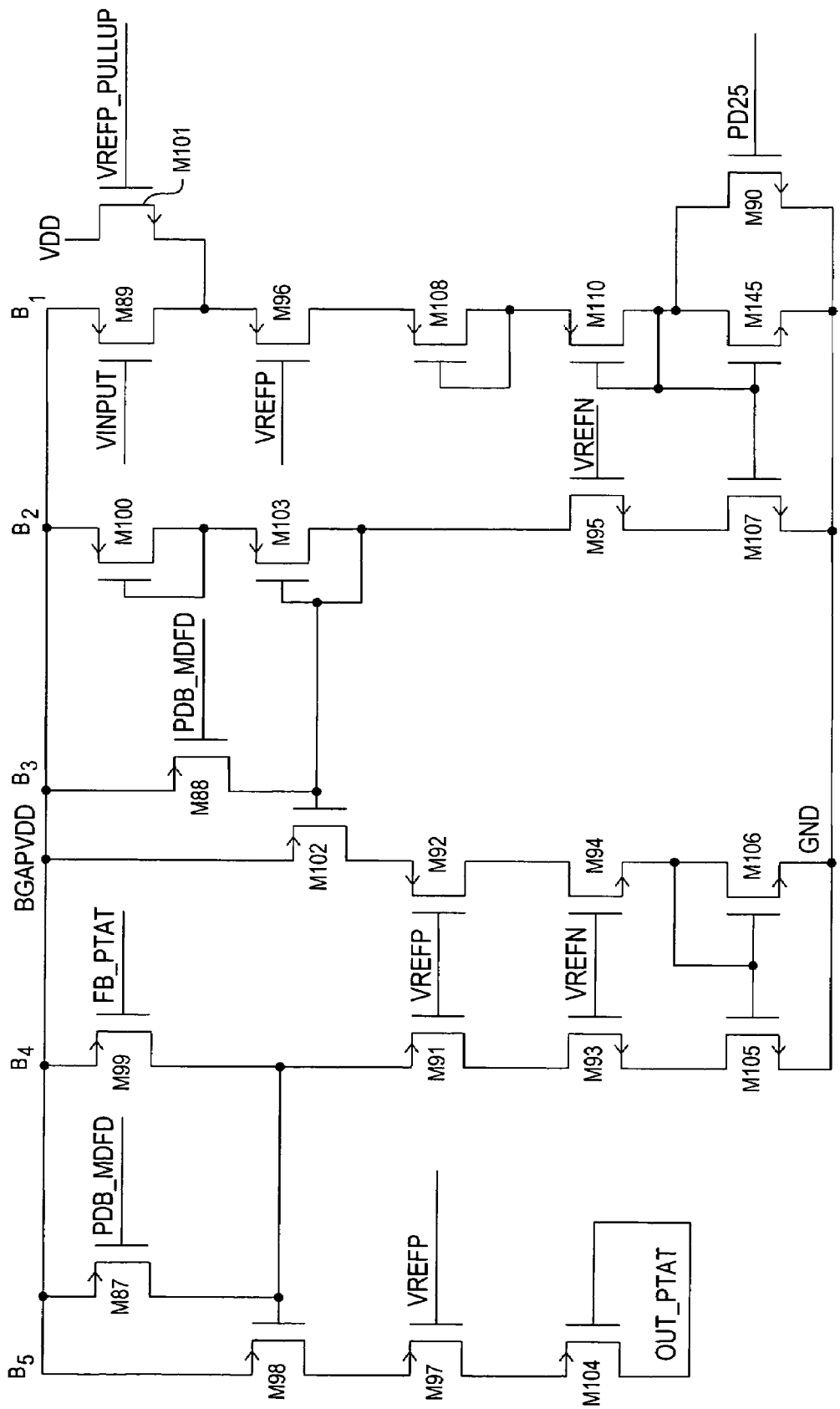
FIG. 10 shows a start-up circuit in accordance with an embodiment of the present invention.

FIG. 10 shows an embodiment of the startup circuitry of FIG. 3A. The output of the startup circuit charges the gate of transistor M64 of the first order temperature compensated reference voltage generating circuit, thereby enabling the transistor M64 and hence starting the circuit operation.

The startup circuit has five branches B1, B2, B3, B4 and B5. The branches are provided with protecting transistors M101, M91, M92, M93, M94, M95, M96 and M97 for introducing intermediate voltage levels so that the voltage stress is avoided. The gates of transistors M91, M92, M96 and M97 are connected to the intermediate voltage level VREFP whereas the gates of the transistors M93, M94, and M95 are connected to the intermediate voltage level VREFN. The gate of transistor M101 is connected VREFP_PULLUP.

Branch B1 has transistor M89 controlled by VINPUT and driven by BGAPVDD, connected serially to the diode-connected transistors M108 and M110 through the protecting transistor M96. Branch B2 has transistors M100, M103 M95 and M107 connected in series wherein transistors M100 and M103 being diode connected. The source of the transistor M100 is connected to the supply BGAPVDD whereas the drain of the transistor M103 provides a voltage to control branch B3 and is connected to transistor M107 through the protecting transistor M95. The gate of transistor M107 is connected to the gates of transistor M110 and M145, thus mirroring the current of branch B1 into branch B2. Branch B3 has serially connected transistors M102 and M106 through the protecting transistors M92 and M94. The sources of the transistors M102 and M106 are connected to the supply BGAPVDD and ground GND respectively. The gate of the transistor M102 is controlled by the gate of the transistor M103. Branch B4 has transistors M99 and M105 connected in series through protecting transistors M91 and M93. The sources of transistors M99 and M105 are respectively connected to supply BGAPVDD and ground GND. The gate of M99 is connected to FB_PTAT. Transistor M105 mirrors the current flowing through the transistor M106. The drain of transistor M99 provides a voltage signal to enable/disable branch B5. Branch B5 has a MOS transistor M98 and a diode-connected transistor M104 connected serially through transistor M97. The drain of diode-connected transistor M104 provides the output of the startup circuit and is connected to gate of transistor M64 of the first order reference voltage generating circuit.

Transistors M87, M88, and M90 are the controlling transistors for putting the startup circuitry in the standby mode. The gates of transistors M87 and M88 connected to PDB_MDFD and the gate of the transistor M90 is connected to signal PD25. The operation of the circuit can be understood as follows:

In the operational mode, the signals PDB_MDFD is high, disabling the transistors M87 and M88, whereas the signals PD25 and VINPUT are grounded respectively disabling and enabling transistors M90 and M89 respectively. Since the transistor M89 is enabled, current flows through branch B1 which is then mirrored in branch B2 by the transistor M107. Due to a flow of current in branch B2, a voltage drop appears across the diode-connected transistors M100 and M103. This voltage drop is approximately 2Vtp. Therefore the gate of transistor M102 is at substantially low voltage thus providing current through the branch B3. The current flowing through the branch B3 is then mirrored by the transistor M106 and M105 in the branch B4.

Initially, when the circuit is not operating, FB_PTAT is high enough to disable transistor M99 whereas transistors M91, M93 and M105 pull the gate of M91 to VREFP+|Vtp|, providing substantial Vsg to M98. Low voltage at the gate of transistor M98 allows the charge to flow through it, therefore charging the tank M67 and the gate of transistor M64 of the first-order temperature-compensated reference voltage generating circuit. Charging up of the gate of transistor M64 enables this transistor to conduct therefore starting up the circuit operation. Once the circuit has started operating, the FB_PTAT is pulled to a low level, enabling transistor M99 to conduct. This, in turn, results in the charging up of the gate of transistor M98 to a value which disables it.

When the branch B2 is conducting, had M95 not been there, we have a possibility of a high drain to source voltage across M107. Similarly when B4 and B3 conduct, a high drain to source voltage is possible for M105 and M106, had M93 and M94 not been there. These problems are eliminated by protection transistors M93, M94 and M95. If the protection transistors M91 and M92 are done away with, during startup operation, as mentioned previously, the gate of M98, instead of pulling down to Vrefp+|Vtp| volts would pull down to zero volts, thereby causing a large source to drain voltage across M99.

When the circuit is in the standby mode, PD25 is raised high, thus pulling the gate of the transistor M107 to ground.

Further, when the transistors M98 and M89 are not conducting, the voltage across there conducting terminals might put these transistors under voltage stress. To avoid this, transistors M97 and M96 respectively are provided to introduce an intermediate voltage level (VREFP+|Vtp|) at the drain terminals of these transistors. M97 and M96 would bring a higher voltage at their source to close to VREFP+|Vtp| but if the voltages at any instant falls below VREFP+|Vtp|, M96 and M97 cannot bring the voltages back to approximately VREP+|Vtp|, hence M101 is added which would supply a very small current to the drain of M89, in the condition when it falls below VREFP+|Vtp|.

The startup circuit can be put in standby mode by enabling transistors M87, M88 and M90 and disabling transistors M89. Enabling transistor M87 and M88 pulls up the gate of the transistors M98 and M102 to BGAPVDD, therefore disconnecting the branches B5 and B3 from the supply. Since branch B3 is disabled, therefore the mirror transistor M105 is disabled and hence the branch B4 is not conducting. Enabling transistor M90 shorts the gate of transistors M110 and M107 to ground, therefore disabling branches B1 and B2.

The outputs of temperature compensated reference signals are fed to the operational amplifier block 4 of FIG. 3A. The first-order temperature-compensated reference voltage serving as the input to the operational amplifier would be referred to as VREGIN hereafter. Since the reference-signal generating block and the operational amplifier share the same power supply, until the time proper amplitude levels of the first-order temperature compensated reference current and voltage has not been obtained, the different nodes within the operational amplifier would have unpredictable voltages which may stress some of the circuit elements within the operational amplifier. Hence standby/power down signals for the operational amplifier have to be generated from the first-order temperature-compensated reference voltage using similar stress free inverter and level shifters shown and described under FIG. 4, FIG. 5 and FIG. 6 respectively.

The voltage VREGIN is fed to a similar inverter as described in FIG. 4 to get an output OUT_VREGIN. Both the VREGIN and OUT_VREGIN are fed to a level shifter similar to the level shifter as shown in FIG. 5 to get voltages VINPUT_VREG and VINPUT_VREGBAR. Further these two voltages VINPUT_VREG and VINPUT_VREGBAR are fed to another voltage level shifter similar to that shown in FIG. 6 to achieve voltage levels, VINPUT_VREG2BAR and PDB_VREG. From the analogy the range of these new voltage levels can be described by following table:

| S. No. | Previous Voltage Levels | New Voltage Levels |
|---|---|---|
| 1. | PD25 | VINPUT_VREGBAR |
| 2. | PDB25 | VINPUT_VREG |
| 3. | PDB_MDFD | PDB_VREG |
| 4. | PDB_SUPP | VINPUT_VREG2BAR |

Figure 11:
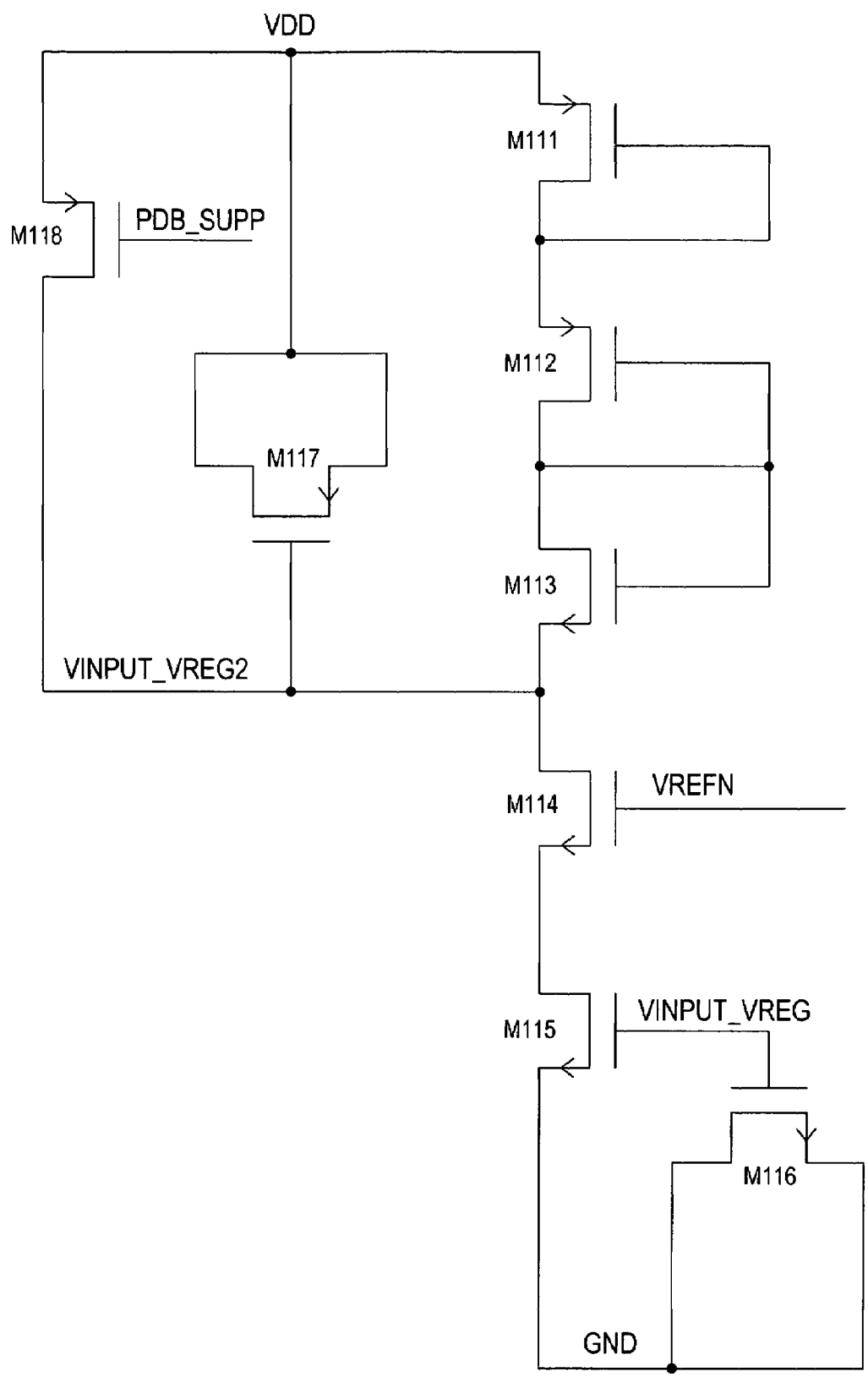
FIG. 11 shows a circuit for generating a power-down signal for the operational amplifier in accordance with an embodiment of the present invention.

Apart from the four signals above, FIG. 11 shows an embodiment of the circuit that generates another power-down signal for the operational amplifier block 4 (FIG. 3A). This circuit receives input VINPUT_VREG and generates power down signal VINPUT_VREG2.

The power-down-signal-generating circuit has a series of diode-connected transistors M111, M112 and M113 with M118 connected in parallel. The source of the transistor M113 is connected to transistor M115 through the protecting transistor M114. The gate of transistors M115 and M114 are connected to the input signal VINPUT_VREG and intermediate voltage VREFN respectively, whereas the gate of transistor M118 is connected to the signal PDB_SUPP. Charge tank M117 is provided in parallel with the transistor M118 whereas the tank M116 is connected at the gate of transistor M115. The operation of the circuit is as follows:

In principle the operation of this circuit is more or less same as the circuit of FIG. 7 the only difference is that this circuit receives the input VINPUT_VREG whereas the former was receiving PDB25. When the signal VINPUT_VREG is low, transistor M115 is not conducting, therefore raising the source of transistor M113 to a high voltage. However subthreshold conduction may decrease this voltage value substantially lower then the VDD value, hence the source of transistor M113 is pulled up to VDD by another transistor M118, having its gate connected to PDB_SUPP.

When signal VINPUT_VREG is high, the transistors M115 is conducting hence the source of transistor M113 is pulled down to a low voltage. At this time the signal PDB_SUPP is also high therefore the transistor M118 is disabled.

A person skilled in the art will appreciate that the VINPUT_VREG2BAR can be used as a power-down signal, however another signal VINPUT_VREG2 is generated for this purpose. This is because the power-down PMOS transistor of the operational-amplifier block (discussed later, in detail) often has to conduct a large amount of current through it without incurring substantial Vsd drop across it, this can only be achieved if a separate signal for this purpose is generated. Following discussion will explain the requirement of signal VINPUT_VREG2.

From the table it is clear that the low value of VINPUT_VREG2BAR is:

VINPUT_VREG2BAR=VREFP+|Vtp|

This implies that at a slow process corner, when |Vtp| would be higher compared to its typical value, VINPUT_VREG2BAR would be at a higher value than the corresponding value in a typical process corner. This implies that the power down PMOS transistor in the operational amplifier block will have a lower Vsg to conduct the current through it. Whereas VINPUT_VREG2 however is so ensured that even if |Vtp| is high in a particular process corner, VINPUT_VREG2 would be lower, thus ensuring a higher Vsg for the PMOS power-down transistor in the operational amplifier block to conduct the current.

Figure 12:
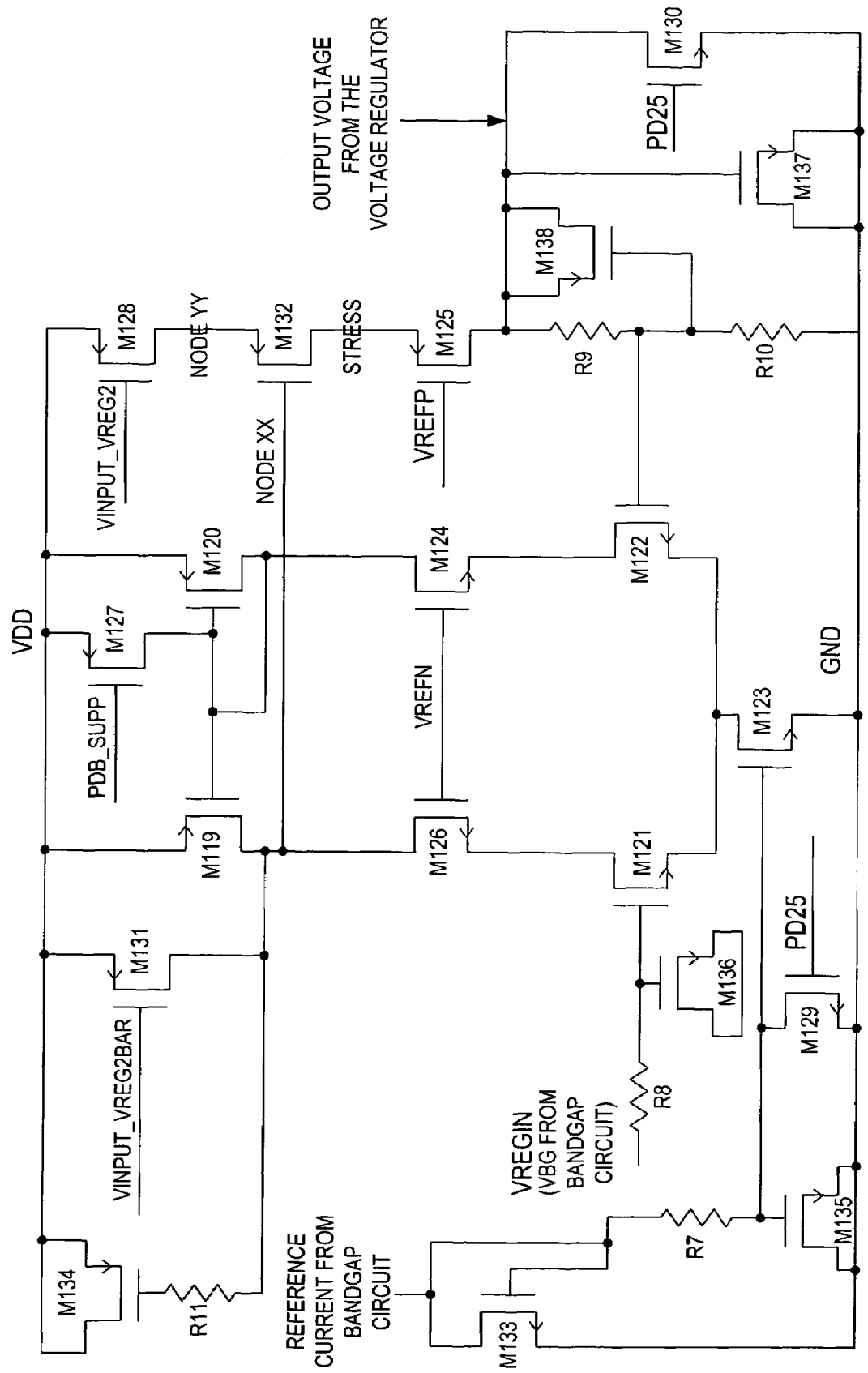
FIG. 12 shows an operational amplifier in accordance with an embodiment of the present invention.

FIG. 12 shows an embodiment of the operational amplifier 4, of FIG. 3A with a resistive feed back network. For the purpose of illustration a two stage amplifier circuit is shown, however a person skilled in the art will appreciate, that the invention is not limited to a two stage operational amplifier and can be exercised using other operational amplifiers.

The operational amplifier shown is a two stage operational amplifier with a circuitry to enable it only when the inputs from the reference signal generating circuit 3 (FIG. 3A) has reached desired levels to prevent the circuit from stresses.

In this circuit, the first stage of the operational amplifier includes transistors M119, M120, M121, M122 and M123 and the second stage includes the gain transistor M132. The drain of the transistor M132 is connected to serially connected resistors R9 and R10 through the protecting transistor M125 and the source of transistor M132 is connected to supply VDD through protecting transistor M128. The gate of transistor M132 is connected to drain of transistor M119. The control transistor M128 has its gate connected to the control signal VINPUT_VREG2. The resistors R9 and R10 provide the resistive feedback to the first stage of the operational amplifier. Protecting transistors M124 and M126, with their gates connected to VREFN, are provided in the first stage of the amplifier to introduce an intermediate voltage level to avoid stresses due to high Vds across transistors M121 and M122. Similarly the transistors M125 has its gate connected to VREFP, which ensures that the gain transistor M132 is not under the voltage stress when the output of the operational amplifier is at ground potential. Further the drain (node STRESS) of the transistor M132 is connected to an additional charging circuitry (see FIG. 13 and described later) for ensuring no voltage stress for the transistors M132. Protecting transistor M125 can ensure that a high voltage at the node STRESS is pulled down to a low voltage but if the node STRESS is pulled below VREFP+ |Vtp|, then M125 becomes ineffective in preventing stresses. The reference voltage signal from the first-order temperature-compensated reference-voltage generator 30 (FIG. 3A) is fed to first input of the first stage of the operational amplifier through the tank circuit having resistor R8 and tank M136, whereas the reference current signal is fed to the gate of tail transistor M123 through the tank circuit having resistor R7 and tank M135. The tank circuit comprising resistor R11 and tank M134 is provided across the transistor M119 to ensure stability of the operation of the circuit. Similarly the tank M137 connecting the output of the operational amplifier and the ground and tank M138 across resistor R9 are provided to stabilize the circuit operation. The transistors M127, M129, M130 and M131 are circuit-operation-enabling transistors respectively connected between supply and gate of transistor M120, gate and ground of M123, ground and output terminal of the operational amplifier and the supply and drain of M119 respectively. Transistors M129 and M130 receives PD25 at their gates whereas the gates of transistors M127 and M131 are connected to PDB_SUPP and VINPUT_VREG2BAR respectively. The regulated output is received from the drain of the transistor M125. The operation of the circuit can be understood as follows:

The circuit is enabled to operate only when the transistors M127, M129, M130 and M131 are disabled and the transistor M128 is enabled. It is to be noted that the voltage levels of the signals VINPUT_VREG2BAR and VINPUT_VREG2 are such that the operational amplifier remains disabled until the time the output of the reference-voltage generating circuit 30 has reached at a desired voltage level therefore avoiding any voltage stress due to the supply rampup.

When the circuit is enabled a current flows through the transistors M128 resulting in a voltage input to the transistor M122 at its gate. The difference of the two voltages at the input of first stage of the amplifier is amplified to provide a voltage to control the current through the transistor M132 to provide a regulated voltage output. The tanks M138, M137 and M134 are present to ensure stability of the circuit at higher frequencies.

The voltage stresses in this operational amplifier are prevented by carefully choosing the sizes of various transistors. For example the size of transistor M125 is sufficiently large so that it can quickly sink input current from the above two transistor M132 and M128, thereby ensuring that the node STRESS is not momentarily charged up to a high voltage value which may stress the transistor M125 itself. Further it has been ensured that the current input to transistor M125 from transistors M132 and M128 is slowly rising with time so that the transistor M125 has sufficient time to sink the current input from transistors M128 and M132 therefore avoiding a high voltage at node STRESS. The slow rise of the current through transistor M128 and M132 is ensured by controlling the gate of the transistor M128 by signal slowly varying signal VINPUT_VREG2.

Further in order to isolate node STRESS and the supply VDD transistor M128 is provided during the supply transient. This is required because, not providing such isolating transistor might result in high Vsg which will subject the transistor M132 to voltage stress during the supply rampup due to the difference in the rise time of node XX and power supply. Also this may further result in charging the node STRESS to a large value, thus subjecting the protecting transistor M125 to voltage stress. Providing isolating transistor M128 will not allow the node YY to charge as fast as the supply due to the slow varying property of signal VINPUT_VREG2.

To ensure that there is no current through the operational amplifier during the power down mode, the temperature-compensated reference-current input to the operational amplifier is fed to a circuit shown in FIG. 14 (described later in detail). Further, the power-down transistor M129 driven by PD25 ensures no tail current to the first stage of the operational amplifier.

Had the reference current input to the operational amplifier not been controlled using the reference voltage, then it may have resulted in the lowering of node XX to such a low voltage which would have stressed some of the transistors in the circuit for a small time e.g. M119, M132 and M128. To prevent such an event to occur, the current input has been strictly controlled from the input reference voltage level.

The expression for the output voltage from the circuit is:

OUTPUTV=VREGIN (1+$R9/R10$)

Figure 13:
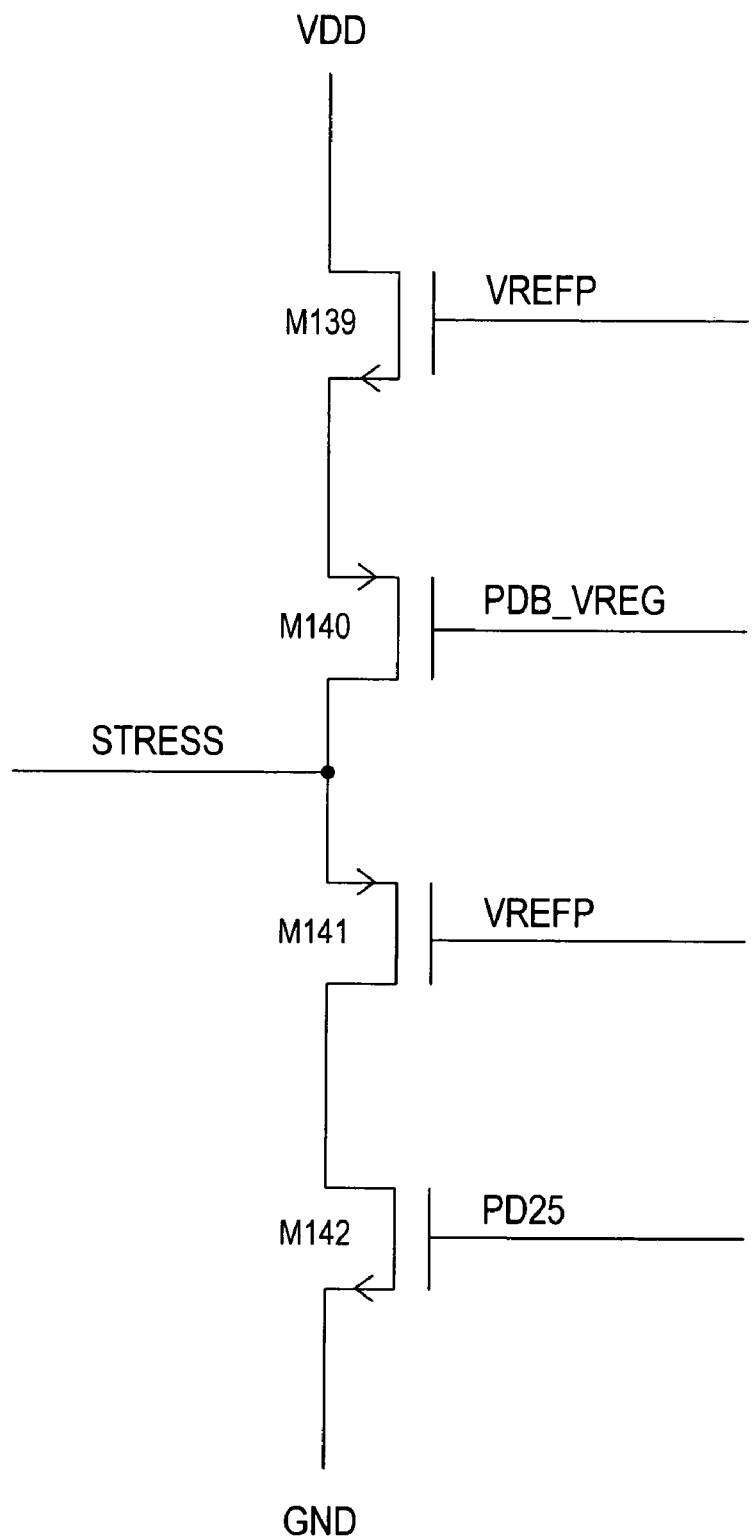
FIG. 13 shows a charging circuit in accordance with an embodiment of the present invention.

FIG. 13 shows an embodiment of a charging circuit. The purpose of this circuit is to charge the node STRESS shown in FIG. 12 to a sufficient value so that the gain transistor M132 is not under voltage stress during supply transient. An additional current is supplied to the node STRESS for the time until proper reference voltage is generated from the reference signal generating block.

The charging circuit has transistors M139, M140, M141 and M142 connected in series between supply VDD and ground GND. The transistors M139 and M141 are the protecting transistors and their gates are connected to VREFP whereas the gates of transistors M140 and M142 are connected to PDB_VREG and PD25 respectively. The node STRESS is connected to the drain of the transistor M140.

The operation of the circuit is as follows:

When the signals PDB_VREG and PD25 are high; the transistor M140 is disabled and transistor M142 is enabled pulling the node STRESS to VREFP+|Vtp|. Whereas when the two signals are low, M139 provides a weak charging current to the node STRESS, so that M132 does not experience high voltage stresses, for the time voltage at the output of the Operational amplifier has not settles to its proper value.

Figure 14:
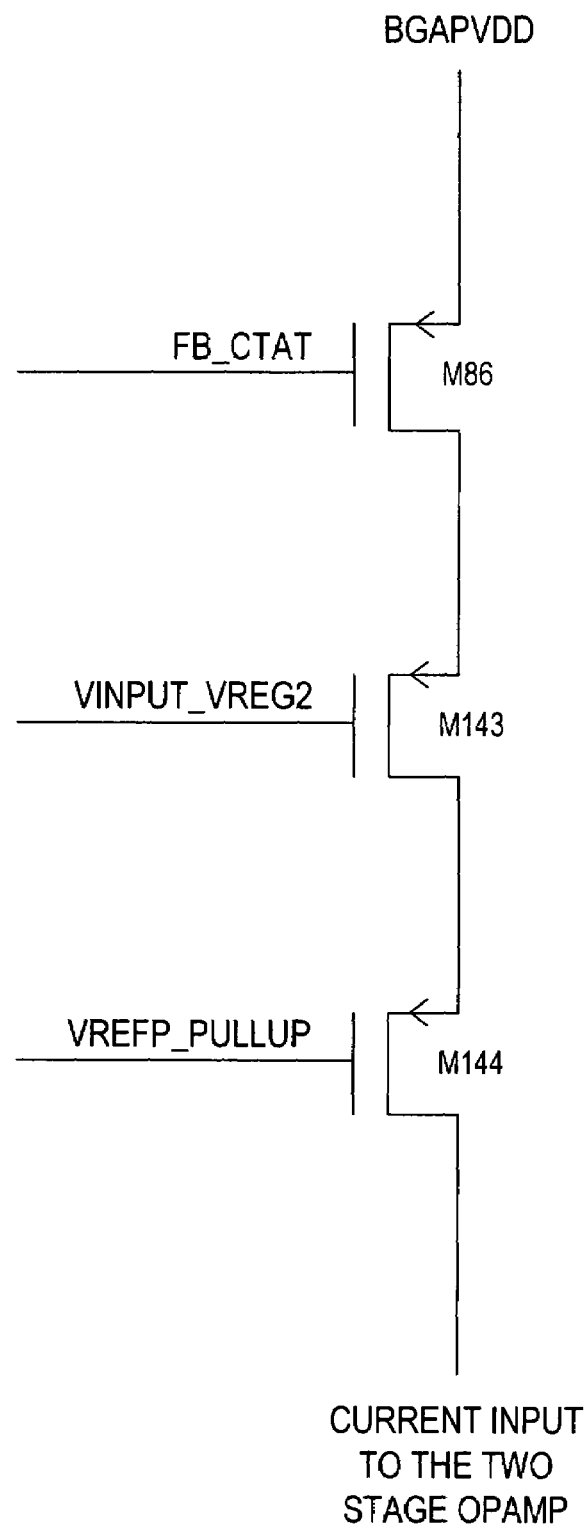
FIG. 14 shows the input-current controlling circuit of an operational amplifier in accordance with an embodiment of the present invention.

FIG. 14 shows an embodiment of an input-current controlling circuit of the operational-amplifier block 4 (FIG. 3A). A current is provided to the operational-amplifier block 4 from the first-order temperature-compensated current-generator circuit 3. This current is controlled using the first-order temperature-compensated reference voltage and flows in the operational amplifier only after the reference voltage has settled to its proper value.

The current-controlling circuit has a controlling transistor M143 and protecting transistors M144 connected in series with the current feeding transistor M86 of first order temperature compensated current generating circuit. A controlled current is allowed to flow through the operational amplifier from the drain of protecting transistor M144.

The transistor M143 conducts only when VINPUT_VREG2 is low. The VINPUT_VREG2 is controlled by VREGIN, which is the internal output of the reference-voltage block 30, therefore no current flows through until the output of reference-voltage block is high enough to drive the operational-amplifier block 4. The transistor M144 introduces an intermediate voltage level to protect transistor M143 in the similar fashion as described for other protection transistors.

For any particular CMOS technology, deciding the aspect ratios of the various transistors in the operational-amplifier block 4 and the values of the resistances are the only parameters required to generate a regulated voltage within +/−10% of the typical voltage of the MOS transistors in that technology.

Without limiting the scope of the invention implementation, the circuit can be implemented using MOS transistors with 50 Å gate oxide thickness having a typical operating voltage of 2.5V and supply voltage of 3.6V.

Hence VREFN=2.5V, VREFP was decided to be 1.1 V and OUTPUTV=2.5V to test the circuit.

The circuit of FIG. 3A may be disposed on one or more integrated circuits, which may compose part of an electronic system.

From the foregoing it will be appreciated that, although specific embodiments of the invention have been described herein for purposes of illustration, various modifications may be made without deviating from the spirit and scope of the invention.

We claim:

1. An improved on-chip voltage regulator providing improved reliability by eliminating voltage stresses on components, comprising:
    a reference signal generating block providing a first-order-temperature compensated voltage reference signal and a first-order-temperature-compensated current reference signal;
    an operational amplifier block providing a regulated voltage, connected to the outputs of said reference signal generating block;
    a standby protection block receiving an external signal for enabling/disabling said reference-signal-generating block and said operational-amplifier block, and;
    a protection voltage block connected to all said blocks;
    wherein predetermined elements of said blocks are connected such that voltage difference between any two terminals is always less than the break down voltage of said element.

2. An improved on chip voltage regulator as claimed in claim 1 wherein said reference signal generating block includes, a first-order temperature-compensated reference-voltage generator with an associated startup circuit for providing the voltage reference output and a first-order temperature-compensated reference-current circuit driven by said reference-voltage generating circuit providing the current reference output.

3. An improved on chipvoltage regulator as claimed in claim 1 wherein said operational-amplifier block includes an operational amplifier with an associated standby circuit.

4. An improved on chip voltage regulator as claimed in claim 1 wherein said protection-voltage block generates first, second and third protection voltages.

5. An improved on chip voltage regulator as claimed in claim 1 wherein said predetermined elements include transistors.

6. An improved on chip voltage regulator as claimed in claim 2 wherein said first-order temperature-compensated reference-voltage circuit includes:
    a current mirroring block comprising a plurality of transistors having common first conducting terminals and common control terminals, said control terminals being connected to a second conducting terminal of a main transistor branch,
    an enabling/disabling transistor having its conducting terminals connected to said common control terminal and said common first conducting terminals and its control terminal driven by said standby-protection block;
    at least one protection transistor connected to the second conducting terminals of said current mirroring transistors, with its control terminal is connected to said first or second protection voltage;
    a band-gap circuit driven by second conducting terminals of a set of first protection transistors;
    a differential amplifier driven by the second conducting terminals of a second protection transistor, receiving an input from said band gap circuit, and having a tank circuit connected to its output,
    a voltage-to-current converter connected to the output of said differential amplifier and driven by the main transistor branch through a third protection transistor and having a startup circuit at its input for initiating operation of the circuit;
    second enabling/disabling transistor connected to the output of said differential amplifier, and being enabled I disabled by a control signal from said standby protection block; and
    an output circuit for providing a voltage reference signal of said reference signal block having a resistor and a bipolar junction transistor connected in series and driven by a second conducting terminal of a fourth protection transistor.

7. An improved on-chip voltage regulator as claimed in claim 2 wherein said first-order temperature-compensated reference-current circuit includes:
    a second current-mirroring block comprising a plurality of transistors having common first conducting terminals and common control terminals, said common control terminals being connected to a second conducting terminal of a main transistor branch;
    an enabling/disabling transistor having its conducting terminals connected to said common control terminal and common first conducting terminals of said transistors while its control terminal is controlled by a control signal from said standby-protection block for enabling/disabling;
    a driving- and an input-generating transistor branch having its first conducting terminals connected to the common first conducting terminal of said second current mirroring block while its control terminal is connected to said common control terminals of said first current-mirroring block;

at least one protection transistor connected to second conducting terminals of each branch of transistors, the control terminal of the said protecting transistor being connected to said first or second protection voltage;

said input generating transistor branch has a resistor and a bipolar junction transistor in series to provide a input between the said bipolar junction transistor and resistor;

a current summer having a pair of bipolar junction transistor and a resistor in parallel driven by first branch of the said second current-mirroring block;

a second differential amplifier driven by said driving transistor branch, receiving its first input from said input generating branch and second input from said current summer, and having a tank circuit connected at its output;

a second voltage-to-current converter connected to the output of said differential amplifier and driven by the main transistor branch through a third protection transistor another enabling/disabling transistor connected to the output of said differential amplifier with its control terminal being controlled by another control signal from said standby protection block for enabling/disabling.

8. An improved on-chip voltage regulator as claimed in claim 1 wherein said standby-protection block includes:
an inverter that receives an external input signal and provides an inverted external output signal;
a first voltage-level shifter that receives an external input signal and inverted external signal and provides a shifted voltage between the ground voltage and a first intermediate voltage;
a second voltage-level shifter that receives a pair of complimentary inputs from said first voltage-level shifter and provides a shifted voltage between supply voltage and a second intermediate voltage level, and;
a Metal Oxide Semiconductor (MOS) switch with support circuitry that receives inputs from the said first and second voltage-level shifters and provides a controlled driving voltage to said first common conducting terminals of the said first and second current-mirroring blocks of said first-order temperature-compensated reference voltage and reference-current circuits;
each said element having protecting elements to provide voltage stress free circuitry.

9. An improved on-chip voltage regulator as claimed in claim 8 wherein said inverter is a stress-free inverter with a protecting element connected between supply and inverter.

10. An improved on-chip voltage regulator as claimed in claim 9 wherein said protecting element is diode-connected transistor connected to another transistor having its control terminal connected to a protection voltage.

11. An improved on-chip voltage regulator as claimed in claim 8 wherein said first voltage level shifter has a diode-connected transistor connected to a pair of transistors between supply and said level shifter, said pair of transistor transistors having their control terminals connected to a protection voltage.

12. An improved on-chip voltage regulator as claimed in claim 8 wherein said second voltage level shifter has a pair of transistors having their control terminals connected to said third protection voltage and conducting terminals connected in parallel with cross-connected transistors of said second voltage-level shifter and said set of protection transistor connected in series between said cross-connected transistors and input transistors of said second voltage-level shifter, said set of protection transistors having their control terminals connected to said first and second protection voltages.

13. An improved on-chip voltage regulator as claimed in claim 8 wherein said MOS switch has a pullup transistor connected in parallel with said MOS switch, said pullup transistor having its control terminal connected to said third protection voltage, the control terminal of MOS switch being connected to a series of diode connected transistors, the current though said series of diode connected transistors being controlled by a series of transistors having their second conducting terminal connected to another series of diode connected transistors through a protection transistor.

14. A voltage regulator, comprising:
an operational amplifier operable to generate a regulated output voltage in response to
a temperature-compensated reference signal, the operational amplifier including,
an enable circuit operable to enable the operational amplifier to generate the regulated output voltage in response to an enable signal,
a first component having a first breakdown voltage, and
a first protection circuit operable to prevent a voltage across the component from exceeding the breakdown voltage in response to a protection signal;
a reference-signal generator coupled to the operational amplifier and operable to generate the temperature-compensated reference signal;
a standby circuit coupled to the operational amplifier and operable to generate the enable signal; and
a protection-signal generator coupled to the operational amplifier and operable to generate the protection signal.

15. The voltage regulator of claim 14 wherein the first component and the protection circuit each comprise a respective transistor.

16. The voltage regulator of claim 14 wherein the reference-signal generator is coupled to the protection-signal generator, includes a second component having a second breakdown voltage, and includes a second protection circuit operable to prevent a voltage across the second component from exceeding the second breakdown voltage in response to the protection signal.

17. The voltage regulator of claim 14 wherein the standby circuit is coupled to the protection-signal generator and is operable to generate the enable signal in response to the protection signal.

18. The voltage regulator of claim 14 wherein the reference signal, the enable signal, and the protection signal each comprise a respective voltage.

19. The voltage regulator of claim 14 wherein the reference signal comprises a current.

20. A method, comprising:
enabling a voltage regulator while preventing a voltage across a component of the regulator from exceeding a breakdown voltage of the component in response to a protection signal; and
generating a regulated output voltage with the enabled voltage regulator in response to a temperature-compensated reference signal while preventing the voltage across the component from exceeding the breakdown voltage in response to the protection signal.

21. The method of claim 20, further comprising:
providing a supply voltage to the regulator; and
generating the protection signal from the supply voltage.

22. A method, comprising:
enabling a voltage regulator while preventing a voltage across a component of the regulator from exceeding a breakdown voltage of the component; and
generating a regulated output voltage with the enabled voltage regulator in response to a first and a second temperature-compensated reference signal while preventing the voltage across the component from exceeding the breakdown voltage,
one of the first and second temperature-compensated reference signals comprising a voltage and the other of the first and second temperature-compensated reference signals comprising a current.

23. The method of claim 22 wherein the first temperature-compensated reference signal comprises a first-order temperature-compensated voltage reference signal, and wherein the second temperature-compensated reference signal comprises a first-order temperature-compensated current reference signal.

24. An integrated circuit, comprising:
a voltage regulator, including,
an operational amplifier operable to generate a regulated output voltage in response to a temperature-compensated reference signal, the operational amplifier including,
an enable circuit operable to enable the operational amplifier to generate the regulated output voltage in response to an enable signal,
a first component having a first breakdown voltage, and
a first protection circuit operable to prevent a voltage across the component from exceeding the breakdown voltage in response to a protection signal,
a reference-signal generator coupled to the operational amplifier and operable to generate the temperature-compensated reference signal,
a standby circuit coupled to the operational amplifier and operable to generate the enable signal, and
a protection-signal generator coupled to the operational amplifier and operable to generate the protection signal.

25. An electronic system, comprising:
an integrated circuit comprising a voltage regulator that includes,
an operational amplifier operable to generate a regulated output voltage in response to a temperature-compensated reference signal, the operational amplifier including,
an enable circuit operable to enable the operational amplifier to generate the regulated output voltage in response to an enable signal,
a first component having a first breakdown voltage, and
a first protection circuit operable to prevent a voltage across the component from exceeding the breakdown voltage in response to a protection signal,
a reference-signal generator coupled to the operational amplifier and operable to generate the temperature-compensated reference signal,
a standby circuit coupled to the operational amplifier and operable to generate the enable signal, and
a protection-signal generator coupled to the operational amplifier and operable to generate the protection signal.

* * * * *

UNITED STATES PATENT AND TRADEMARK OFFICE
CERTIFICATE OF CORRECTION

PATENT NO. : 7,286,003 B2  Page 1 of 1
APPLICATION NO. : 11/209351
DATED : October 23, 2007
INVENTOR(S) : Kallol Chatterjee and Nitin Agarwal It is certified that error appears in the above-identified patent and that said Letters Patent is hereby corrected as shown below:

Column 18 Claim 3 line 1 enter a space between "chipvoltage" to read
--chip[ ]voltage--
Column 18 Claim 6 line 39 remove the "I" after enabled and replace with --/--

Signed and Sealed this

First Day of July, 2008

JON W. DUDAS
*Director of the United States Patent and Trademark Office*